(12) United States Patent
Bonham et al.

(10) Patent No.: US 9,839,940 B2
(45) Date of Patent: Dec. 12, 2017

(54) APPARATUS FOR DEPOSITING A MULTILAYER COATING ON DISCRETE SHEETS

(71) Applicant: Samsung Display Co., Ltd., Yongin (KR)

(72) Inventors: Charles C. Bonham, Richland, WA (US); Paul E. Burrows, Kennewick, WA (US); Xi Chu, Freemond, CA (US); Gordon Lee Graff, West Richland, WA (US); Mark Edward Gross, Pasco, WA (US); Peter Maclyn Martin, Kennewick, WA (US); Lorenza Moro, San Carlos, CA (US); Kenneth Jeffrey Nelson, Sunnyvale, CA (US); John Chris Pagano, Santa Clara, CA (US); Mac R. Zumhoff, Kennewick, WA (US)

(73) Assignee: Samsung Display Co., Ltd., Yongin (KR)

( * ) Notice: Subject to any disclaimer, the term of this patent is extended or adjusted under 35 U.S.C. 154(b) by 667 days.

(21) Appl. No.: 14/049,560

(22) Filed: Oct. 9, 2013

(65) Prior Publication Data
US 2014/0037845 A1 Feb. 6, 2014

Related U.S. Application Data

(62) Division of application No. 10/412,133, filed on Apr. 11, 2003, now Pat. No. 8,808,457.

(51) Int. Cl.
*C23C 14/56* (2006.01)
*C23C 16/54* (2006.01)
(Continued)

(52) U.S. Cl.
CPC ............ *B05D 7/50* (2013.01); *C23C 14/58* (2013.01); *C23C 16/54* (2013.01);
(Continued)

(58) Field of Classification Search
None
See application file for complete search history.

(56) References Cited

U.S. PATENT DOCUMENTS 2,382,432 A 8/1945 McManus et al.
2,384,500 A 9/1945 Stoll
(Continued)

FOREIGN PATENT DOCUMENTS

BE 704297 2/1968
CA 2 353 506 5/2000
(Continued)

OTHER PUBLICATIONS

De Gryse, R., et al., Sputtered Transparent Barrier Layers, 10th International Conference on Vacuum Web Coating (Edited by R. Bakish) aka the 10th Bakish Conference; 1996, pp. 190-198.
(Continued)

*Primary Examiner* — Karla Moore
(74) *Attorney, Agent, or Firm* — Dinsmore & Shohl LLP

(57) ABSTRACT

A tool for depositing multilayer coatings onto a substrate. The tool includes a housing defining a vacuum chamber connected to a vacuum source, deposition stations each configured to deposit a layer of multilayer coating on the substrate, a curing station, and a contamination reduction device. At least one of the deposition stations is configured to deposit an inorganic layer, while at least one other deposition station is configured to deposit an organic layer. In one tool configuration, the substrate may travel back and forth through the tool as many times as needed to achieve the desired number of layers of multilayer coating. In another,
(Continued)

the tool may include numerous housings adjacently spaced such that the substrate may make a single unidirectional pass. The contamination reduction device may be configured as one or more migration control chambers about at least one of the deposition stations, and further includes cooling devices, such as chillers, to reduce the presence of vaporous layer precursors. The tool is particularly well-suited to depositing multilayer coatings onto flexible substrates, as well as to encapsulating environmentally-sensitive devices placed on the flexible substrate.

8 Claims, 8 Drawing Sheets

(51) Int. Cl.
| | |
|---|---|
| H01L 51/56 | (2006.01) |
| B05D 7/00 | (2006.01) |
| C23C 14/58 | (2006.01) |
| H01L 21/67 | (2006.01) |
| H01L 51/00 | (2006.01) |

(52) U.S. Cl.
CPC ...... *H01L 21/67236* (2013.01); *H01L 51/001* (2013.01); *H01L 51/56* (2013.01)

(56) References Cited

U.S. PATENT DOCUMENTS

| | | | |
|---|---|---|---|
| 3,475,307 A | 10/1969 | Knox et al. | |
| 3,496,427 A | 2/1970 | Lee | |
| 3,607,365 A | 9/1971 | Lindlof | |
| 3,661,117 A | 5/1972 | Cornelius et al. | |
| 4,061,835 A | 12/1977 | Poppe et al. | |
| 4,098,965 A | 7/1978 | Kinsman | |
| 4,266,223 A | 5/1981 | Frame | |
| 4,283,482 A | 8/1981 | Hattori et al. | |
| 4,313,254 A * | 2/1982 | Feldman | H01L 31/02242 118/719 |
| 4,426,275 A | 1/1984 | Meckel et al. | |
| 4,521,458 A | 6/1985 | Nelson | |
| 4,537,814 A | 8/1985 | Itoh et al. | |
| 4,555,274 A | 11/1985 | Kitajima et al. | |
| 4,557,978 A | 12/1985 | Mason | |
| 4,572,845 A | 2/1986 | Christen | |
| 4,581,337 A | 4/1986 | Frey et al. | |
| 4,624,867 A | 11/1986 | Iijima et al. | |
| 4,690,728 A | 9/1987 | Tsang et al. | |
| 4,695,618 A | 9/1987 | Mowrer | |
| 4,710,426 A | 12/1987 | Stephens | |
| 4,722,515 A | 2/1988 | Ham | |
| 4,768,666 A | 9/1988 | Kessler | |
| 4,842,893 A | 6/1989 | Yializis et al. | |
| 4,842,983 A * | 6/1989 | Hasegawa | G03F 7/0236 430/175 |
| 4,843,036 A | 6/1989 | Schmidt et al. | |
| 4,855,186 A | 8/1989 | Grolig et al. | |
| 4,889,609 A | 12/1989 | Cannella | |
| 4,913,090 A | 4/1990 | Harada et al. | |
| 4,931,158 A | 6/1990 | Bunshah et al. | |
| 4,934,315 A | 6/1990 | Linnebach et al. | |
| 4,954,371 A | 9/1990 | Yializis | |
| 4,977,013 A | 12/1990 | Ritchie et al. | |
| 5,032,461 A | 7/1991 | Shaw et al. | |
| 5,036,249 A | 7/1991 | Pike-Biegunski et al. | |
| 5,047,131 A | 9/1991 | Wolfe et al. | |
| 5,059,861 A | 10/1991 | Littman et al. | |
| 5,124,204 A | 6/1992 | Yamashita et al. | |
| 5,189,405 A | 2/1993 | Yamashita et al. | |
| 5,203,898 A | 4/1993 | Carpenter et al. | |
| 5,204,314 A | 4/1993 | Kirlin et al. | |
| 5,237,439 A | 8/1993 | Misono et al. | |
| 5,260,095 A | 11/1993 | Affinito | |
| 5,336,324 A | 8/1994 | Stall et al. | |
| 5,344,501 A | 9/1994 | Hashimoto et al. | |
| 5,354,497 A | 10/1994 | Fukuchi et al. | |
| 5,356,947 A | 10/1994 | Ali et al. | |
| 5,357,063 A | 10/1994 | House et al. | |
| 5,376,467 A | 12/1994 | Abe Takao et al. | |
| 5,393,607 A | 2/1995 | Kawasaki et al. | |
| 5,395,644 A | 3/1995 | Affinito | |
| 5,402,314 A | 3/1995 | Amago et al. | |
| 5,427,638 A | 6/1995 | Goetz et al. | |
| 5,440,446 A | 8/1995 | Shaw et al. | |
| 5,451,449 A | 9/1995 | Shetty et al. | |
| 5,461,545 A | 10/1995 | Leroy et al. | |
| 5,464,667 A | 11/1995 | Kohler et al. | |
| 5,510,173 A | 4/1996 | Pass et al. | |
| 5,512,320 A | 4/1996 | Turner et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,578,141 A | 11/1996 | Mori et al. | |
| 5,607,789 A | 3/1997 | Treger et al. | |
| 5,620,524 A | 4/1997 | Fan et al. | |
| 5,629,389 A | 5/1997 | Roitman et al. | |
| 5,652,192 A | 7/1997 | Matson et al. | |
| 5,654,084 A | 8/1997 | Egert | |
| 5,660,961 A | 8/1997 | Yu | |
| 5,665,280 A | 9/1997 | Tropsha | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,695,564 A | 12/1997 | Imahashi | |
| 5,711,816 A | 1/1998 | Kirlin et al. | |
| 5,725,909 A | 3/1998 | Shaw et al. | |
| 5,731,661 A | 3/1998 | So et al. | |
| 5,736,207 A | 4/1998 | Walther et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,771,177 A | 6/1998 | Tada et al. | |
| 5,771,562 A | 6/1998 | Harvey, III et al. | |
| 5,782,355 A | 7/1998 | Katagiri et al. | |
| 5,792,550 A | 8/1998 | Phillips et al. | |
| 5,795,399 A | 8/1998 | Hasegawa et al. | |
| 5,811,177 A | 9/1998 | Shi et al. | |
| 5,811,183 A | 9/1998 | Shaw et al. | |
| 5,821,138 A | 10/1998 | Yamazaki et al. | |
| 5,821,692 A | 10/1998 | Rogers et al. | |
| 5,844,363 A | 12/1998 | Gu et al. | |
| 5,861,658 A | 1/1999 | Cronin et al. | |
| 5,869,791 A | 2/1999 | Young | |
| 5,872,355 A | 2/1999 | Hueschen | |
| 5,891,554 A | 4/1999 | Hosokawa et al. | |
| 5,895,228 A | 4/1999 | Biebuyck et al. | |
| 5,902,641 A | 5/1999 | Affinito et al. | |
| 5,902,688 A | 5/1999 | Antoniadis et al. | |
| 5,904,958 A | 5/1999 | Dick et al. | |
| 5,912,069 A | 6/1999 | Yializis et al. | |
| 5,919,328 A | 7/1999 | Tropsha et al. | |
| 5,920,080 A | 7/1999 | Jones | |
| 5,922,161 A | 7/1999 | Wu et al. | |
| 5,929,562 A | 7/1999 | Pichler | |
| 5,934,856 A * | 8/1999 | Asakawa | C23C 16/54 414/217 |
| 5,945,174 A | 8/1999 | Shaw et al. | |
| 5,948,552 A | 9/1999 | Antoniadis et al. | |
| 5,952,778 A | 9/1999 | Haskal et al. | |
| 5,955,161 A | 9/1999 | Tropsha | |
| 5,965,907 A | 10/1999 | Huang et al. | |
| 5,968,620 A | 10/1999 | Harvey et al. | |
| 5,994,174 A | 11/1999 | Carey et al. | |
| 5,996,498 A | 12/1999 | Lewis | |
| 6,004,660 A | 12/1999 | Topolski et al. | |
| 6,013,337 A | 1/2000 | Knors | |
| 6,040,017 A | 3/2000 | Mikhael et al. | |
| 6,045,864 A | 4/2000 | Lyons et al. | |
| 6,066,826 A | 5/2000 | Yializis | |

(56) References Cited

U.S. PATENT DOCUMENTS

| | | |
|---|---|---|
| 6,083,313 A | 7/2000 | Venkatraman et al. |
| 6,083,628 A | 7/2000 | Yializis |
| 6,084,702 A | 7/2000 | Byker et al. |
| 6,087,007 A | 7/2000 | Fujii et al. |
| 6,092,269 A | 7/2000 | Yializis et al. |
| 6,106,627 A | 8/2000 | Yializis |
| 6,117,266 A | 9/2000 | Horzel et al. |
| 6,118,218 A | 9/2000 | Yializis et al. |
| 6,146,225 A | 11/2000 | Sheats et al. |
| 6,146,462 A | 11/2000 | Yializis et al. |
| 6,150,187 A | 11/2000 | Zyung et al. |
| 6,165,566 A | 12/2000 | Tropsha |
| 6,178,082 B1 | 1/2001 | Farooq et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 * | 7/2001 | Affinito ............... H01L 51/5237 313/504 |
| 6,274,201 B1 | 8/2001 | Borom et al. |
| 6,274,204 B1 | 8/2001 | Affinito |
| 6,322,860 B1 | 11/2001 | Stein et al. |
| 6,333,065 B1 | 12/2001 | Arai et al. |
| 6,348,237 B2 | 2/2002 | Kohler et al. |
| 6,350,034 B1 | 2/2002 | Fleming et al. |
| 6,352,777 B1 | 3/2002 | Bulovic et al. |
| 6,358,570 B1 | 3/2002 | Affinito |
| 6,361,885 B1 | 3/2002 | Chou |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,460,369 B2 | 10/2002 | Hosokawa |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,469,438 B2 | 10/2002 | Fukuoka et al. |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |
| 6,569,515 B2 | 5/2003 | Hebrink et al. |
| 6,570,325 B2 | 5/2003 | Graff et al. |
| 6,570,714 B2 | 5/2003 | Soane et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,664,137 B2 | 12/2003 | Weaver |
| 6,681,716 B2 | 1/2004 | Schaepkens |
| 6,734,625 B2 | 5/2004 | Vong et al. |
| 6,737,753 B2 | 5/2004 | Kumar et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,827,788 B2 | 12/2004 | Takahashi |
| 6,835,950 B2 | 12/2004 | Brown et al. |
| 6,836,070 B2 | 12/2004 | Chung et al. |
| 6,837,950 B1 | 1/2005 | Berard |
| 6,852,356 B2 | 2/2005 | Nishikawa |
| 6,864,629 B2 | 3/2005 | Miyaguchi et al. |
| 6,866,901 B2 | 3/2005 | Burrows et al. |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,902,905 B2 | 6/2005 | Burson et al. |
| 6,905,769 B2 | 6/2005 | Komada |
| 6,911,667 B2 | 6/2005 | Pichler et al. |
| 6,936,131 B2 | 8/2005 | McCormick et al. |
| 6,975,067 B2 | 12/2005 | McCormick et al. |
| 6,994,933 B1 | 2/2006 | Bates |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,033,850 B2 | 4/2006 | Tyan et al. |
| 7,056,584 B2 | 6/2006 | Iacovangelo |
| 7,074,501 B2 | 7/2006 | Czeremuszkin et al. |
| 7,086,918 B2 | 8/2006 | Hsiao et al. |
| 7,112,351 B2 | 9/2006 | Affinito |
| 7,122,418 B2 | 10/2006 | Su et al. |
| 7,156,942 B2 | 1/2007 | McCormick et al. |
| 7,166,007 B2 | 1/2007 | Auch et al. |
| 7,183,197 B2 | 2/2007 | Won et al. |
| 7,198,832 B2 | 4/2007 | Burrows et al. |
| 7,221,093 B2 | 5/2007 | Auch et al. |
| 7,255,823 B1 | 8/2007 | Guenther et al. |
| 7,298,072 B2 | 11/2007 | Czeremuszkin et al. |
| 7,621,794 B2 | 11/2009 | Lee et al. |
| 2001/0006827 A1 | 7/2001 | Yamazaki et al. |
| 2001/0015074 A1 | 8/2001 | Hosokawa |
| 2001/0015620 A1 | 8/2001 | Affinito |
| 2001/0044035 A1 | 11/2001 | Morii |
| 2002/0015818 A1 | 2/2002 | Takahashi et al. |
| 2002/0022156 A1 | 2/2002 | Bright |
| 2002/0025444 A1 | 2/2002 | Hebgrink et al. |
| 2002/0036297 A1 | 3/2002 | Pichler |
| 2002/0038997 A1 * | 4/2002 | Sakai ....................... C02F 3/04 313/495 |
| 2002/0068143 A1 | 6/2002 | Silvernail |
| 2002/0069826 A1 | 6/2002 | Hunt et al. |
| 2002/0096114 A1 | 7/2002 | Carducci et al. |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1 | 10/2002 | Weaver |
| 2003/0038590 A1 | 2/2003 | Silvernail et al. |
| 2003/0085652 A1 | 5/2003 | Weaver |
| 2003/0098647 A1 | 5/2003 | Silvernail et al. |
| 2003/0117068 A1 | 6/2003 | Forrest et al. |
| 2003/0124392 A1 | 7/2003 | Bright |
| 2003/0127973 A1 | 7/2003 | Weaver et al. |
| 2003/0134487 A1 | 7/2003 | Breen et al. |
| 2003/0184222 A1 | 10/2003 | Nilsson et al. |
| 2003/0197197 A1 | 10/2003 | Brown et al. |
| 2003/0203210 A1 | 10/2003 | Graff et al. |
| 2003/0205845 A1 | 11/2003 | Pichler et al. |
| 2003/0218422 A1 | 11/2003 | Park et al. |
| 2003/0235648 A1 | 12/2003 | Affinito et al. |

(56) References Cited

U.S. PATENT DOCUMENTS

| | | |
|---|---|---|
| 2004/0002729 A1 | 1/2004 | Zamore |
| 2004/0014265 A1 | 1/2004 | Kaslaza et al. |
| 2004/0018305 A1 | 1/2004 | Pagano et al. |
| 2004/0029334 A1 | 2/2004 | Bijker et al. |
| 2004/0031442 A1 | 2/2004 | Yamazaki et al. |
| 2004/0046497 A1 | 3/2004 | Schaepkens et al. |
| 2004/0071971 A1 | 4/2004 | Iacovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0145304 A1 | 7/2004 | Choi et al. |
| 2004/0175512 A1 | 9/2004 | Schaepkens |
| 2004/0175580 A1 | 9/2004 | Schaepkens |
| 2004/0187999 A1 | 9/2004 | Wilkinson et al. |
| 2004/0209090 A1 | 10/2004 | Iwanaga |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0115603 A1 | 6/2005 | Yoshida et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0174045 A1 | 8/2005 | Lee et al. |
| 2005/0176181 A1 | 8/2005 | Burrows et al. |
| 2005/0202646 A1 | 9/2005 | Burrows et al. |
| 2005/0212419 A1 | 9/2005 | Vazan et al. |
| 2005/0224935 A1 | 10/2005 | Schaepkens et al. |
| 2005/0238846 A1 | 10/2005 | Arakatsu et al. |
| 2005/0239294 A1 | 10/2005 | Rosenblum et al. |
| 2006/0003474 A1 | 1/2006 | Tyan et al. |
| 2006/0006799 A1 | 1/2006 | Yamazaki et al. |
| 2006/0028128 A1 | 2/2006 | Ohkubo |
| 2006/0061272 A1 | 3/2006 | McCormick et al. |
| 2006/0062937 A1 | 3/2006 | Padiyath et al. |
| 2006/0063015 A1 | 3/2006 | McCormick et al. |
| 2006/0132461 A1 | 6/2006 | Furukawa et al. |
| 2006/0216951 A1 | 9/2006 | Moro et al. |
| 2006/0246811 A1 | 11/2006 | Winters et al. |
| 2006/0250084 A1 | 11/2006 | Cok et al. |
| 2006/0291034 A1 | 12/2006 | Patry et al. |
| 2007/0009674 A1 | 1/2007 | Okubo et al. |
| 2007/0049155 A1 | 3/2007 | Moro et al. |
| 2007/0164376 A1 | 7/2007 | Burrows et al. |
| 2007/0187759 A1 | 8/2007 | Lee et al. |
| 2008/0032076 A1 | 2/2008 | Dujardin et al. |
| 2008/0231180 A1 | 9/2008 | Waffenschmidt et al. |
| 2009/0258235 A1 | 10/2009 | Tateishi |

FOREIGN PATENT DOCUMENTS

| | | |
|---|---|---|
| DE | 196 03 746 A1 | 4/1997 |
| DE | 696 15 510 T2 | 6/1997 |
| DE | 10 2004 063 619 A1 | 7/2006 |
| EP | 0 147 696 B1 | 7/1985 |
| EP | 0 299 753 A2 | 1/1989 |
| EP | 0 340 935 A2 | 11/1989 |
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 611 037 A1 | 8/1994 |
| EP | 0 722 787 A2 | 7/1996 |
| EP | 0 777 280 A2 | 6/1997 |
| EP | 0 777 281 A2 | 6/1997 |
| EP | 0 787 824 A2 | 8/1997 |
| EP | 0 787 826 A1 | 8/1997 |
| EP | 0 915 105 A1 | 5/1999 |
| EP | 0 916 394 A2 | 5/1999 |
| EP | 0 931 850 A1 | 7/1999 |
| EP | 0 977 469 A2 | 2/2000 |
| EP | 1 021 070 A1 | 7/2000 |
| EP | 1 127 381 | 8/2001 |
| EP | 1 130 420 A2 | 9/2001 |
| EP | 1 278 244 A2 | 1/2003 |
| EP | 1514317 A1 | 3/2005 |
| EP | 1 719 808 A2 | 11/2006 |
| EP | 1 857 270 A1 | 11/2007 |
| GB | 2 210 826 A | 6/1989 |
| JP | 63-96895 | 4/1988 |
| JP | 63136316 | 6/1988 |
| JP | 64-41192 | 2/1989 |
| JP | 01041067 | 2/1989 |
| JP | 02183230 | 7/1990 |
| JP | 3-183759 | 8/1991 |
| JP | 06-013258 A | 12/1991 |
| JP | 03290375 | 12/1991 |
| JP | 4-14440 | 1/1992 |
| JP | 4-48515 | 2/1992 |
| JP | 04267097 | 9/1992 |
| JP | 0615305 | 11/1992 |
| JP | 5501587 | 3/1993 |
| JP | 5-147678 | 6/1993 |
| JP | 05182759 | 7/1993 |
| JP | 5290972 | 11/1993 |
| JP | 06-136159 | 5/1994 |
| JP | 61-79644 | 6/1994 |
| JP | 06-196260 | 7/1994 |
| JP | 06-223966 | 8/1994 |
| JP | 6234186 A | 8/1994 |
| JP | 07147189 | 6/1995 |
| JP | 07192866 | 7/1995 |
| JP | 8-72188 | 3/1996 |
| JP | 08171988 | 7/1996 |
| JP | 08179292 | 7/1996 |
| JP | 08-203669 | 8/1996 |
| JP | 8-318590 | 12/1996 |
| JP | 08325713 | 12/1996 |
| JP | 09059763 | 4/1997 |
| JP | 09132774 | 5/1997 |
| JP | 9-201897 | 8/1997 |
| JP | 10-725 | 1/1998 |
| JP | 10-013083 | 1/1998 |
| JP | 10312883 | 11/1998 |
| JP | 11040344 | 2/1999 |
| JP | 11-149826 | 6/1999 |
| JP | 11255923 | 9/1999 |
| JP | 02-117973 A | 4/2002 |
| JP | 2003282239 A | 10/2003 |
| JP | 3579556 B2 | 10/2004 |
| WO | 87/07848 | 12/1987 |
| WO | 89/00337 | 1/1989 |
| WO | 91/07519 A1 | 5/1991 |
| WO | 95/10117 | 4/1995 |
| WO | 96/23217 | 8/1996 |
| WO | 97/04885 | 2/1997 |
| WO | 97/16053 | 5/1997 |
| WO | 97/22631 | 6/1997 |
| WO | 98/10116 | 3/1998 |
| WO | 98/18852 | 5/1998 |
| WO | 99/16557 | 4/1999 |
| WO | 99/16931 | 4/1999 |
| WO | 99/33651 A1 | 7/1999 |
| WO | 99/46120 | 9/1999 |
| WO | 00/26973 | 5/2000 |
| WO | 00/35603 | 6/2000 |
| WO | 00/35604 | 6/2000 |
| WO | 00/35993 | 6/2000 |
| WO | 00/36661 | 6/2000 |
| WO | 00/36665 | 6/2000 |

(56) References Cited

FOREIGN PATENT DOCUMENTS

| WO | WO 0036665 A1 * | 6/2000 | ......... H01L 51/5256 |
|---|---|---|---|
| WO | 0157904 A1 | 8/2001 | |
| WO | 2004/089620 A2 | 10/2001 | |
| WO | 01/81649 A1 | 11/2001 | |
| WO | 01/82336 A2 | 11/2001 | |
| WO | 01/82389 A1 | 11/2001 | |
| WO | 01/87825 A1 | 11/2001 | |
| WO | 01/89006 A1 | 11/2001 | |
| WO | 02/26973 A1 | 4/2002 | |
| WO | 02/051626 A1 | 7/2002 | |
| WO | 02071506 A1 | 9/2002 | |
| WO | 03/016589 A1 | 2/2003 | |
| WO | 03/090260 A2 | 10/2003 | |
| WO | 03/090260 A3 | 10/2003 | |
| WO | 03/098716 A1 | 11/2003 | |
| WO | 2004/006199 A3 | 1/2004 | |
| WO | 2004/016992 A1 | 2/2004 | |
| WO | 2004/070840 A1 | 8/2004 | |
| WO | 2005/015655 A1 | 2/2005 | |
| WO | 2005/045947 A2 | 5/2005 | |
| WO | 2005/048368 A1 | 5/2005 | |
| WO | 2006/036492 A1 | 4/2006 | |
| WO | 2006/093898 A1 | 9/2006 | |
| WO | 2007013001 A2 | 2/2007 | |
| WO | 2007013001 A3 | 2/2007 | |
| WO | 2008097297 A2 | 8/2008 | |
| WO | 2008097297 A3 | 8/2008 | |
| WO | 2008097297 A9 | 8/2008 | |
| WO | 2008/144080 A1 | 11/2008 | |

OTHER PUBLICATIONS

Wong, C.P., Recent Advanced in IC Passivation and Encapsulation: Process Techniques and Materials; Polymers for Electronic and Photonic Applications; AT&T Bell Laboratories, 1993, pp. 167-209.
Shi, M.K., et al., In-Situ and Real-Time Monitoring of Plasma-Induced Etching PET and Acrylic Films, Plasma and Polymers, Dec. 1999, 4(4), pp. 1-25.
Affinito, J.D., et al., Vacuum Deposited Polymer/Metal Multilayer Films for Optical Applications; Paper No. C1.13; International Conference on Metallurgical Coatings; Apr. 15-21, 1995, pp. 1-14.
Affinito, J.D., et al., Vacuum Deposition of Polymer Electrolytes on Flexible Substrates, Proceedings in the Ninth International Conference on Vacuum Web Coating, Nov. 1995, edited by R. Bakish, Bakish Press 1995, pp. 20-36.
PCT International Search Report, Application No. PCT/US99/29853 dated Mar. 3, 2000.
Yializis A., et al., Ultra High Barrier Films, 43rd Annual Technical Conference Proceedings, Denver, CO, Apr. 15-20, 2000, pp. 404-407.
Henry, B.M., et al., Microstructural and Gas Barrier Properties of Transparent Aluminum Oxide and Indium Tin Oxide Films, 43rd Annual Technical Conference Proceedings, Denver, CO, Apr. 15-20, 2000, pp. 373-378.
Affinito, J.D., et al., Vacuum Deposition of Polymer Electrolytes on Flexible Substrates, The Ninth International Conference on Vacuum Web Coatings, 1995, pp. 0-16.
Norenberg, H., et al., Comparative Study of Oxygen Permeation Through Polymers and Gas Barrier Films, 43rd Annual Technical Conference Proceedings, Denver, CO., Apr. 15-20, 2000, pp. 347-351.
Mahon, J.K., et al., Requirements of Flexible Substrates for Organic Light Emitting Devices in Flat Panel Display Applications; Society of Vacuum Coaters, 42nd Annual Technical Conference Proceedings, Apr. 1999, pp. 456-459.
Tropsha et al., Activated Rate Theory Treatment of Oxygen and Water Transport through Silicon Oxide/Poly (ethylene terphthalate) Composite Barrier Structures; J. Phys. Chem B Mar. 1997; pp. 2259-2266.
Tropsha et al., Combinatorial Barrier Effect of the Multilayer SiOx Coatings on Polymer Substrates; Society of Vacuum Coaters; 40th Annual Technical Conferences Proceedings; Apr. 12-17, 1997, pp. 64-69.
Affinito, J.D., et al., Ultra High Rate, Wide Area, Plasma Polymerized Films from High Molecular Weight/Low Vapor Pressure Liquid or Solid Monomer Precursors; 45th International Symposium of the American Vacuum Society, Nov. 2-6, 1998; pp. 0-26.
Felts, J.T., Transparent Barrier Coatings Update: Flexible Substrates; 36th Annual Technical Conference Proceedings; Apr. 25-30, 1993, pp. 324-331.
Affinito, J.D., et al., Molecularly Doped Polymer Composite Films for Light Emitting Polymer Application Fabricated by the PML Process, 41st Technical Conference of the Society of Vacuum Coaters; Apr. 1998, pp. 220-225.
Affinito, J.D., et al., Vacuum Deposited Conductive Polymer Films; The 11th International Conference on Vacuum Web Coating, Nov. 9-11, 1997, pp. 0-12.
Affinito, J.D., et al., Polymer/Polymer, Polymer/Oxide, and Polymer/Metal Vacuum Deposited Interferences Filters; 10th International Vacuum Web Coating Conference, Nov. 1996, pp. 0-14.
Kukla, R., et al., Transparent Barrier Coatings with EB-Evaporation, an Update; Section Five; Transparent Barrier Coating Papers; Thirteenth International Conference on Vacuum Web Coatings; Oct. 17-19, 1999, pp. 222-233.
Bright, Clark I., Transparent Barrier Coatings Based on ITO for Flexible Plastic Displays; Thirteenth International Conference on Vacuum Web Coatings, Oct. 17-19, 1999, pp. 247-255.
Henry, B.M., et al., Microstructural Studies of Transparent Gas Barrier Coatings on Polymer Substrates; Thirteenth International Conference on Vacuum Web Coatings; Oct. 17-19, 1999, pp. 265-273.
Hibino, N., et al., Transparent Barrier A12O3 Coating by Activated Reactive Evaporation; Thirteenth International Conference on Vacuum Web Coatings, Oct. 17-19, 1999, pp. 234-245.
Shi, M.K., et al., Plasma Treatment of PET and Acrylic Coating Surfaces-I. In situ XPS Measurements; Journal of Adhesion Science and Technology, Mar. 2000, 14(12); pp. 1-28.
Affinito, J.D., et al., PML/Oxide/PML Barrier Layer Performance Differences Arising From Use of UV or Electron Beam Polymerization of the PML Layers, SVC 40th Annual Technical Conference, Apr. 12-17, 1997; pp. 19-25.
Yializis, A., et al., High Oxygen Barrier Polypropylene Films Using Transparent Acrylate-A2O3 and Opaque Al-Acrylate Coatings; Society of Vacuum Coaters, 1995, pp. 95-102.
Shaw, D.G., et al., Use of Vapor Deposited Acrylate Coatings to Improve the Barrier Properties of Metallized Film; Society of Vacuum Coaters, 1994, pp. 240-244.
Affinito, J.D., et al., Vacuum Deposited Conductive Polymer Films, the 11th International Conference on Vacuum Web Coating, no earlier than Feb. 1998, pp. 200-213.
Bunshah, R.F., et al., Deposition Technologies for Films and Coatings, Noyes Publications, Park Ridge, New Jersey, 1982, p. 339.
Affinito, J.D., Energy Res. Abstract 18(6), #17171, 1993.
Atsuhisa Inoue, et al., Fabrication of a Thin Film of MNA by Vapour Deposition, Proc. of the 33rd Japan Conference on Materials Research, U.33, pp. 177-179, 1990.
Affinito, J.D., et al., Ultrahigh Rate, Wide Area, Plasma Polymerized Films from High Molecular Weight/Low Vapor Pressure Liquid or Solid Monomer Precursors; American Vacuum Society, Journal Vacuum Science Technology A 17 (4), Jul./Aug. 1999, pp. 1974-1982.
Graupner, W., et al., High Resolution Color Organic Light Emitting Diode Microdisplay Fabrication Method, SPIE Proceedings, Nov. 6, 2000, pp. 11-19.
Czeremuszkin, G., et al., Permeation Through Defects in Transparent Barrier Coated Plastic Films, 43rd Annual Technical Conference Proceedings, Apr. 15, 2000, pp. 408-413.
Vossen, J.L., et al., Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.

(56) References Cited

OTHER PUBLICATIONS

Gustafason, G., et al., Flexible Light-Emitting Diodes Made from Soluble Conducting Polymers; Letters to Nature, vol. 357, Jun. 11, 1992, pp. 477-479.
Penning, F.M., Electrical Discharges in Gases; 1965, pp. 1-51; Gordon and Breach, Science Publishers, New York-London-Paris.
Affinito, J.D., et al., High Rate Vacuum Deposition of Polymer Electrolytes; Journal Vacuum Science Technology A 14(3), May/Jun. 1996.
Phillips, R.W., Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.
Yamada, Y., et al., The Properties of a New Transparent and Colorless Barrier Film, Society of Vacuum Coaters, 1995, pp. 28-31.
Chahroudi, D., Transparent Glass Barrier Coatings for Flexible Film Packaging; Society of Vacuum Coaters, 1991; pgs. 130-133.
Krug, T., et al., New Developments in Transparent Barrier Coatings, Society of Vacuum Coaters, 1993, pp. 302-305.
Affinito, J.D., et al., A New Method for Fabricating Transparent Barrier Layers, Thin Solid Film 290-291, 1996, pp. 63-37.
Affinito, J.D., et al., Polymer-Oxide Transparent Barrier Layers, SVC 39th Annual Technical Conference; Vacuum Web Coating Session, 1996, pp. 392-397.
Hoffman, G., et al., Transparent Barrier Coatings by Reactive Evaporation; Society of Vacuum Coaters, 1994, pp. 155-160.
Klemberg-Sapieha, J.E., et al., Transparent Gas Barrier Coatings Produced by Dual-Frequency PECVD: Society of Vacuum Coaters, 1993, pp. 445-449.
Finson, E., et al., Transparent SiO2 Barrier Coatings: Conversion of Production Status; Society of Vacuum Coaters, 1994, pp. 139-143.
Affinito, J.D., et al., Ultra High Rate, Wide Area, Plasma Polymerized Films From High Molecular Weight/Low Vapor Pressure Liquid or Liquid/Solid Suspension Monomer Precursors; MRS Conference, Nov. 29, 1998-Dec. 3, 1998, Paper No. Y12.1.
Chwang et al., Thin Film Encapsulated Flexible Organic Electroluminescent Displays, Applied Physics Letter, vol. 83, No. 3, Jul. 21, 2003, pp. 413-415.
Akedo et al., Plasma-CVD SiNx/Plasma-Polymerized Cnx:H Multilayer Passivation Films from Organic Light Emitting Diodes, Society of Information Display Digest of Technical Papers, vol. 34, No. 1, May 1, 2003, pp. 559-561.
Advisory Action of U.S. Appl. No. 10/412,133, dated Apr. 8, 2008.
Advisory Action of U.S. Appl. No. 10/412,133, dated Aug. 8, 2008.
Advisory Action of U.S. Appl. No. 11/112,880, dated Jul. 23, 2009.
Advisory Action of U.S. Appl. No. 11/693,022, dated Oct. 21, 2009.
Election/Restrictions Requirement of U.S. Appl. No. 10/412,133, dated Dec. 28, 2004.
Election/Restrictions Requirement of U.S. Appl. No. 11/112,880, dated Jul. 25, 2008.
Election/Restrictions Requirement of U.S. Appl. No. 11/693,020, dated Aug. 8, 2008.
Election/Restrictions Requirement of U.S. Appl. No. 11/693,022, dated Oct. 7, 2008.
Advisory Action of U.S. Appl. No. 11/068,356, dated Feb. 12, 2008.
Election/Restrictions Requirement of U.S. Appl. No. 11/693,020, dated Jun. 25, 2009.
Election/Restrictions Requirement of U.S. Appl. No. 11/509,837, dated Mar. 4, 2009.
Notice of Allowance of U.S. Appl. No. 11/776,616, dated Sep. 18, 2009.
Office Action of U.S. Appl. No. 11/693,022, dated Jan. 23, 2009.
Office Action of U.S. Appl. No. 10/412,133, dated Mar. 3, 2006.
Office Action of U.S. Appl. No. 10/412,133, dated Mar. 28, 2005.
Office Action of U.S. Appl. No. 11/112,880, dated May 28, 2009.
Advisory Action of U.S. Appl. No. 11/068,356, dated Mar. 30, 2009.
Office Action of U.S. Appl. No. 11/693,022, dated Aug. 18, 2009.
Office Action of U.S. Appl. No. 10/412,133, dated Sep. 5, 2007.
Office Action of U.S. Appl. No. 10/412,133, dated Sep. 7, 2006.
Office Action of U.S. Appl. No. 11/776,616, dated Sep. 26, 2008.
Office Action of U.S. Appl. No. 10/412,133, dated Nov. 3, 2005.
Office Action of U.S. Appl. No. 11/112,880, dated Dec. 3, 2008.
Office Action of U.S. Appl. No. 10/412,133, dated Dec. 11, 2007.
Office Action of U.S. Appl. No. 11/693,020, dated Dec. 30, 2008.
Election/Restrictions Requirement of U.S. Appl. No. 11/068,356, dated Oct. 17, 2008.
Office Action of U.S. Appl. No. 11/068,356, dated Jan. 22, 2009.
Office Action of U.S. Appl. No. 11/068,356, dated Apr. 4, 2008.
Office Action of U.S. Appl. No. 11/068,356, dated Jun. 10, 2009.
Office Action of U.S. Appl. No. 11/068,356, dated Jun. 15, 2007.
Office Action of U.S. Appl. No. 11/068,356, dated Nov. 28, 2007.
Office Action of U.S. Appl. No. 11/509,837, dated Jun. 30, 2009.
Advisory Action of U.S. Appl. No. 11/693,020, dated Dec. 15, 2009.
Election/Restrictions Requirement of U.S. Appl. No. 11/509,837, dated Dec. 14, 2009.
Examiner's Answer of U.S. Appl. No. 10/412,133, dated Nov. 12, 2009.
Office Action of U.S. Appl. No. 11/068,356, dated Dec. 7, 2009.
Office Action of U.S. Appl. No. 11/627,583, dated Dec. 1, 2009.
Office Action of U.S. Appl. No. 11/693,020, dated Oct. 29, 2009.
Election/Restrictions Requirement of U.S. Appl. No. 12/345,912, dated Oct. 27, 2009.
Notice of Allowance of U.S. Appl. No. 11/693,022, dated Dec. 29, 2009.
International Search Report and Written Opinion pertaining to International Appl. No. PCT/US2009/060437 dated Feb. 17, 2010.
International Search Report and Written Opinion pertaining to International Appl. No. PCT/US2009/066518 dated Feb. 15, 2010.
Japanese Office Action pertaining to Japanese Patent Appl. No. 2003-586919 dated Dec. 16, 2009.
Chinese Office Action pertaining to Chinese Patent Appl. No. 200580049572.8 dated Jan. 28, 2010.
Notice of Allowance of U.S. Appl. No. 11/693,022, dated Jan. 28, 2010.
Wong, et al., Long-Lifetime Thin-Film Encapsulated Organic Light-Emitting Diodes, Journal of Applied Physics 104, 014509 (2008), pp. 104-107, American Institute of Physics, USA.
European Patent Office—Office Action dated Nov. 23, 2016 pertaining to EP06075683.0.

\* cited by examiner

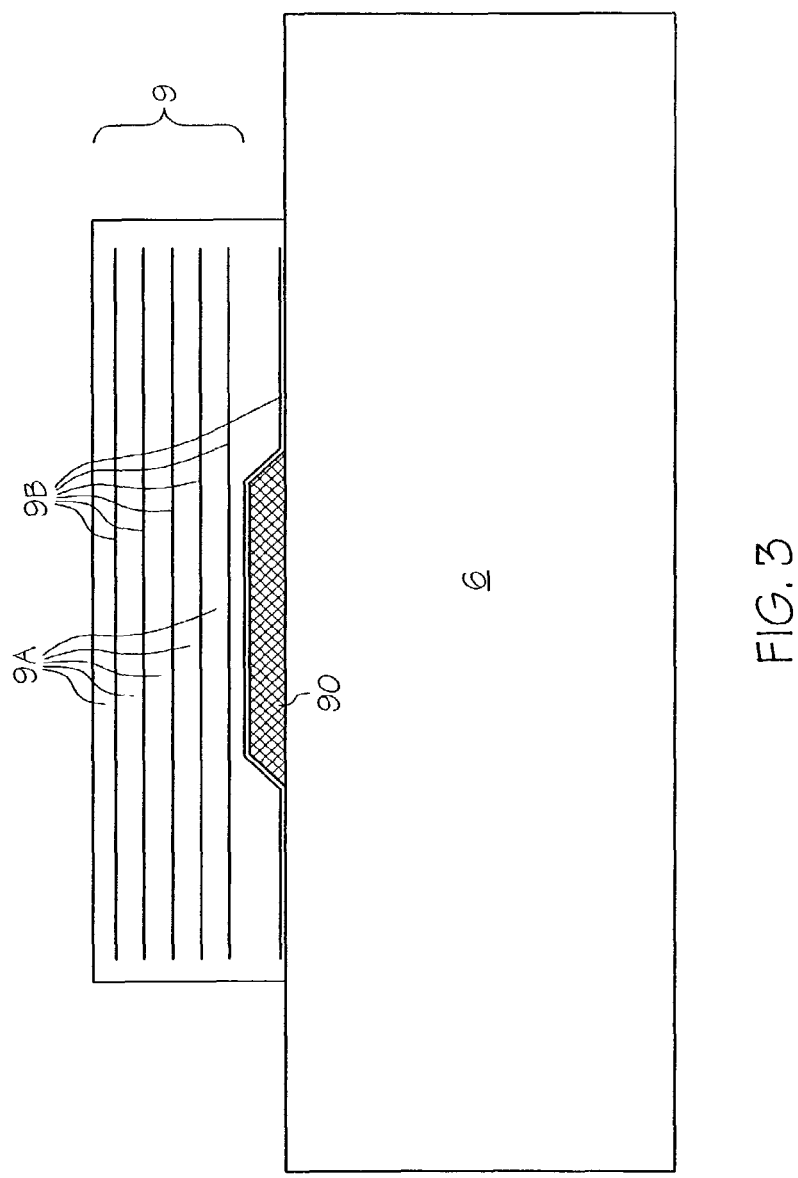

APPARATUS FOR DEPOSITING A MULTILAYER COATING ON DISCRETE SHEETS

CROSS-REFERENCE TO RELATED APPLICATION

This application is a divisional application of U.S. patent application Ser. No. 10/412,133 filed Apr. 11, 2003, the entire disclosure of which is hereby incorporated herein by reference.

BACKGROUND OF THE INVENTION

The present invention relates generally to an apparatus for depositing multilayer coatings onto sheet substrates and devices mounted thereon, and more particularly to an encapsulation tool that performs multilayer coating processing while simultaneously reducing the likelihood of individual layer contamination.

Multilayer coatings have been included in the packaging for environmentally sensitive products and devices to protect them from permeation of environmental gases or liquids, such as oxygen and water vapor in the atmosphere, or chemicals used in product or device processing, handling, storage, or use. In one form, these coatings may be made from layers of an inorganic metal or metal oxide separated by layers of an organic polymer. Such coatings have been described in, for example, U.S. Pat. Nos. 6,268,695, 6,413,645 and 6,522,067, and allowed U.S. patent application Ser. No. 09/889,605, all incorporated herein by reference. One method commonly used to apply thin multilayer coatings to various web substrates is the "roll-to-roll" method, which involves mounting the continuous web substrate on a reel. A series of rotating drums are used to convey the substrate past one or more deposition stations. As the web passes around the drums in the system, polymer layers are deposited and cured at one or more polymer deposition and curing stations, while inorganic layers are deposited at one or more inorganic layer deposition stations. The deposition and curing stations are not separate chambers coupled together, but rather are adjacently spaced relative to one another within a single vacuum chamber. With such an open architecture, efforts must typically be made to minimize migration of the organic vapor which could otherwise lead to layer or substrate contamination. In addition, since vapor deposition imparts a significant heat load to the receiving substrate, one or more of the drums can be configured to provide a needed heat sink to control substrate temperature. While the roll-to-roll method is capable of high production rates, its practical use is limited to substrates that are continuous lengths (rolls). In addition, the flexure inherent in the roll-to-roll approach makes it difficult to deposit coatings onto rigid substrates or to substrates supporting inflexible devices mounted thereto.

When the substrate to be coated is in the form of discrete sheets, rather than a continuous web, another method, called the "cluster tool" method, is commonly used to apply the multilayer coatings to the sheet substrate. The cluster tool method, which is commonly used in the manufacture of semiconductor devices, involves the use of two or more independent vacuum chambers connected together via common interface, where each vacuum chamber contains one or more deposition sources. In the cluster tool approach, discrete sheet substrates are moved from one vacuum chamber to another to accept the different layers thereon, with the process being repeated as many times as necessary to produce the desired built-up coating. One of the strong motivators for developing the cluster tool approach was the need to isolate potential contamination sources between adjacent yet disparate layers, where typically isolation valves are placed between adjacent chambers. In fact, the use of cluster tool-based machinery for the barrier coating industry was based in part on the perception that organic and inorganic deposition could not take place within a common vacuum chamber if contamination was to be avoided. Another attribute of the cluster tool approach is that the potential for precise temperature control of the substrate is greater within each discrete vacuum chamber than it is for the open chambers of the roll-to-roll configuration. While the cluster tool approach has the benefit of producing relatively contaminant-free finished products, the constant exchange of the sheet substrate from one isolated vacuum chamber to another while maintaining a vacuum adds considerable complexity to design and control systems.

Accordingly, there is a need for a tool that can apply multilayer coatings to a sheet substrate and devices or products mounted on a sheet substrate that combines the speed and efficiency of roll-to-roll devices with the ability to prevent cross contamination inherent in cluster tool-based machines.

SUMMARY OF THE INVENTION

This need is met by the apparatus of the present invention, where the individual layers making up the multilayer coating can be deposited in-line in an open (common environment) architecture. By avoiding the necessity of having numerous decoupled stations, encapsulation production rates and overall tool simplicity is maximized, while proper control of the material being deposited meliorates individual layer contamination by minimizing the tendency of the material in gaseous form to disperse to adjacent deposition stations. The present inventors have discovered that various isolation devices can be added to the vacuum chamber to reduce or eliminate the chance of interlayer contamination without having to isolate adjacent deposition stations.

According to an aspect of the invention, a tool for in-line deposition of multilayer coatings on a discrete sheet substrate is disclosed. In the present context, an in-line tool is to be distinguished from a roll-to-roll tool in that first, an in-line tool is configured to handle discrete sheets while the roll-to-roll tool handles continuous webs, and second, the deposition stations along an in-line tool generally follow a linear, planar path (which may encompass either unidirectional/one pass movement or a shuttling/multi-pass movement) so that during coating processing the tool does not subject the substrate (and any devices mounted thereto) to overly curvaceous paths that might otherwise be harmful to either the coating or the device encapsulated by the coating. In this context, the deposition path is considered to be substantially linear. An in-line tool is distinguished from a cluster tool in that in the in-line tool, the deposition of the various layers of the multilayer coating occur in a continuous, sequential path while in a common environment, whereas in a cluster tool, the various layers are deposited in autonomous chambers isolated from both the ambient environment and neighboring chambers. The tool includes a proximal end configured to accept the substrate, a distal end opposite the proximal end, and at least one housing disposed substantially between the proximal and distal ends. The housing defines a substantially linear deposition path to facilitate transport of the substrate through the tool, and is made up of at least one of each organic layer deposition station, curing station and inorganic layer deposition station, as well as at least one contamination reduction means to control the migration of material making up the organic layer from the organic layer station in which the material originated. The housing further defines a common vacuum throughout which the organic, curing and inorganic stations are placed positioned such that at least the inorganic layer deposition station and the organic layer deposition station are, upon operation of a vacuum source coupled to the common vacuum, in vacuum communication with one another. The inorganic layer deposition station is configured to deposit at least one inorganic layer of the multilayer coating, while the organic layer deposition station is configured to deposit at least one organic layer of the multilayer coating, and the curing station is configured to cure the organic layer deposited by the organic layer deposition station. Both of the organic and inorganic layer deposition stations are configured such that they can deposit layers onto the substrate. In the present context, deposition of a layer "onto" the substrate encompasses both application in direct contact with the underlying substrate as well as application onto one or more layers previously deposited on the substrate as part of a contiguous stack. In this way, either the organic layer or the inorganic layer may be deposited first, yet both layers, even in a multilayer configuration, are considered to be deposited onto the substrate. The substantially linear deposition path of the present in-line configuration is such that physical isolation within separate, autonomous stations is not required.

Optionally, the tool may include additional components, including one or more mask stations. These may be made up of an organic mask placement device and an inorganic mask placement device, each configured to place an appropriately shaped and sized mask onto the substrate prior to entering the organic and inorganic stations, respectively. One or both of the proximal and distal ends may be configured as an accumulator such that it can contain a batch of the substrates at least before, after or between multilayer coating deposition steps. In the present context, a "batch" of substrates encompasses one or more individual substrate sheets that are placed within the isolated, controlled environment of the tool such that they are processed in a single tool run. Thus, whereas a plurality of substrates could include a continuous stream of such substrates being individually fed into the tool, a batch of such substrates is that subset of a plurality that is produced in quantities limited by the capacity of the accumulator rather than the size of the continuous stream. In situations where both ends of the tool are accumulators, the tool can process a plurality (preferably two) substrate batches simultaneously. In the present context, the term "simultaneously" refers not to having individual substrates from each of the two batches be exposed to the same deposition concurrently (which would in essence amount to a degenerate case of the two batches), but to the ability of the tool to sequence its various depositioning and curing steps such that all of the substrates within one batch can be shuttled past the appropriate station or stations and returned to one of the accumulators prior to the next deposition step being performed on the other batch within the tool. Thus, between the time the substrate batches are loaded and isolated within the tool and the time they exit the tool, more than one batch can be produced. The accumulators can be further configured to reverse the substrate along the substantially linear deposition path such that multiple layers of multilayer coating may be deposited. As the first device along the in-line tool that the substrate encounters, the accumulator can be configured to at least partially isolate the one or more substrates from an ambient, external environment. In the present context, partial environmental isolation includes the ability of the accumulator to reduce at least one of the vacuum or temperature levels in the region that contains the substrate down to a level necessary to permit proper operating conditions for the substrate prior to or during the multilayer coating deposition process. The accumulator may include thermal control features to reduce the temperature within the accumulator. With this feature, the accumulator acts as a temperature control unit to counteract the increase in temperature experienced by the substrate or device due to the deposition process. The accumulator may further include an environmental isolation valve such that once the substrate (or substrates) is placed within the accumulator, the valve can be shut, after which temperature and vacuum levels may optionally be changed.

The tool may further comprise at least one surface treatment chamber configured to enhance the ability of individual layers of the multilayer coating to adhere to the substrate or an adjacent layer. The surface treatment chamber may be placed within the housing, the accumulator or adjacent to either. The tool can be configured such that the inorganic layer is placed onto the substrate prior to the placement of the first organic layer. While the use of sputtering is beneficial in allowing the tool to function to apply multilayer barriers, other forms, including thermal evaporation, allow the tool to perform encapsulation functions as well without subjecting the environmentally sensitive device being encapsulated to harsh environments, e.g., high temperatures and/or plasmas. Special measures may be undertaken to avoid damage to the environmentally sensitive device (such as an organic light emitting diode (OLED)) that can otherwise arise from being exposed to the plasmas and/or temperatures of the sputter coating process. In one approach, the first deposited inorganic layer can be deposited via thermal evaporation rather than sputtering. By way of example, since thermal evaporation is a currently-used approach for forming the metallic top electrode of an OLED, such an inorganic layer deposition approach could also be used as an encapsulation-enhancement approach. Unlike commonly-used oxides, such as aluminum oxide ($Al_2O_3$), that are applied by reactive sputtering, inorganics such as lithium fluoride (LiF) and magnesium fluoride ($MgF_2$) (both of which are optically transparent) can also be applied via thermal evaporation to create a protective layer without having to expose the environmentally sensitive device to the plasma. Similarly, the approach could utilize an inorganic transparent metal halide via thermal evaporation, a sputtered transparent inorganic or first deposited organic, or a simpler approach in which thermal evaporation is used for the first deposited inorganic. The latter would require a first deposited inorganic that can be applied by thermal evaporation and provide a combination of adhesion and transparency.

In one form, the contamination reduction means is a thermal control device disposed adjacent at least one side of the organic layer deposition station, preferably disposed adjacent upstream and downstream sides of the organic layer deposition station. By way of example, the thermal control means can be a chiller configured to reduce the atmospheric conditions within and around the organic layer deposition station, or it could be a thermal mass. By way of example, a first chiller can be located within the first migration control chamber located adjacent station inlet, with a second chiller located within the second migration control chamber adjacent station outlet. Other chiller placement and configuration is also contemplated, depending on the system needs. For example, these chillers may be in the form of cold inert gas (such as nitrogen) injection devices placed upstream and downstream of the organic deposition station. Besides thermal control devices, the contamination reduction means can include at least one baffle placed adjacent at least one side of the organic layer deposition station such that a tortuous path is set up, thereby making it more difficult for excess organic layer material to migrate out of the organic layer deposition station and into other stations.

The tool can be configured to have the substrate shuttle back and forth through the housing as many times as required to deposit the multilayer coating on the substrate. To effect the shuttling movement, one or more conveyers extending through the one or more housings may be included to transport the substrate through at least a portion of the tool. The conveyor can be configured to move bidirectionally between the proximal and distal ends. The tool may also include a testing chamber to facilitate testing of the resistance of the multilayer coating to environmental attack. Examples of environmental attack that multilayer barrier coatings are configured to prevent include permeation by oxygen and water. Thus a current approach to testing permeation resistance is based on vacuum deposition of a thin layer sensitive to oxygen or water (for example, calcium) followed by deposition of a multilayer barrier coating to produce a sample that can be tested. A test chamber facilitating this approach contains a station for vacuum deposition of the thin sensitive layer onto uncoated substrates to produce test blanks that have sensitivity similar to an OLED. The ability to prepare the test sample in the same environment (vacuum that is maintained through out the process) used for application of the multilayer barrier coating increases accuracy (validity) and reduces turnaround time for test results.

A control system may be included to determine operability of the various tool components and process conditions within the housing, as well as be responsive to process parameters, such as temperature, scanning speed, presence of contaminants, or the like. The vacuum source may provide a different vacuum level during deposition of the inorganic layer than during deposition of the organic layer. By way of example, the vacuum level during deposition of the inorganic layer can be approximately 3 millitorr, while that during deposition of the organic layer can be approximately 10 millitorr. In another option, the inorganic layer deposition station comprises a rotary sputtering source, which may include a rotatable cathode.

Preferably, the inorganic layer is deposited onto the substrate prior to the placement of the organic layer. The inventors have discovered that placing an inorganic (such as an oxide) layer first results in improved adhesion between the substrate and between layers, as well as improved barrier properties. The inventors have further discovered that in situations involving encapsulation of an object (such as an OLED) placed on the substrate, superior adhesion and barrier properties are achieved using "inorganic first" approaches. Thus, while the inclusion of an organic layer continues to make valuable contributions to the overall performance of the multilayer coating, the inventors' research suggests that attainment of a suitable base (or foundation) for effectively isolating the barrier from undesirable contributions from the underlying substrate (or device) may be best achieved with one or more inorganic layer/organic layer pairs led by an inorganic layer. By placing an inorganic layer onto a substrate (such as glass or a plastic) first, the inventors have achieved adhesion to substrates, to devices placed on substrates, and between layers of multilayer environmental barriers, all of which withstand the physical and thermal rigors of the environment in which they have to perform. Furthermore, when these layers form the surface upon which a device is placed, they survive all of the processing associated with fabrication of the device. The inventors believe that at least one explanation may be that migration of organic species from the substrate to this first-applied layer is reduced compared to if the first layer is the organic layer, and that such migration reduction promotes and maintains enhanced adhesion between the substrate and the first-applied layer. In addition, in cases involving deposition onto a device mounted on the substrate, the inventors believe that with a first deposited organic layer, the layer does not adequately wet, or uniformly coat, the device surface. This could be due to species originating in the organic layers of the device being coated, not having a suitable formulation for the first deposited organic layer relative to the device, or a combination of both. On the other hand, an "organic first" approach (at least in encapsulation situations) would reduce or even eliminate the potential for damage to the device from the plasma used in depositing inorganic layers.

According to yet another aspect of the invention, a tool for encapsulating objects between a multilayer coating and a flexible substrate is disclosed. The tool includes at least one housing substantially defining a common vacuum and a substantially linear deposition path therein, a vacuum pump coupled to the vacuum chamber, a first accumulator positioned upstream of the housing, and a second accumulator positioned downstream of the housing. The first accumulator is configured to provide at least partial environmental isolation of the substrate from an external ambient environment once the substrate has been placed in the substantially linear deposition path, while the second accumulator is configured to provide at least partial environmental isolation of the substrate from an external ambient environment, as well as to reverse the substrate along the substantially linear deposition path such that multiple layers of the multilayer coating may be deposited on the substrate. The housing is made up of at least at least one organic layer deposition station, at least one curing station, at least one inorganic layer deposition station, a mask station configured to place an organic mask and an inorganic mask on the substrate and at least one contamination reduction device to control the migration of material making up the organic layer. Optionally, the tool may further include a fixturing device positioned upstream of the first accumulator, while at least one of the accumulators may include a thermal control device. Additionally, the first accumulator comprises a substrate input path and a substrate output path, the substrate output path spaced apart from the substrate input path.

According to yet another aspect of the invention, an encapsulation tool for in-line depositing a multilayer coating on a substrate to protect an object placed thereon is disclosed. The tool includes one at least one housing substantially defining a common vacuum and a substantially linear deposition path therein, means for depositing a first material over the object while the object is in the at least one housing, means for curing the first material while the object is in the at least one housing, means for depositing a second material over the object while the object is in the at least one housing, means for providing a vacuum in the at least one housing such that the means for depositing first material, the means for depositing second material and the means for curing the first material are in vacuum communication with one another, and means for controlling the migration of the first material from the means for depositing a first material. Optionally, the encapsulation tool is configured such that either the first or second material can be first applied to be adjacent the substrate, while the housing can be configured as a plurality of housings sequentially coupled such that the common vacuum is common to each of the plurality of housings. As with the previous aspects, at least one accumulator may be included to at least partially isolate the substrate from an external ambient environment. The accumulator can be in selective vacuum communication with the housing, and may comprise a device configured to reduce the temperature within the accumulator.

According to still another aspect of the invention, a method of depositing a multilayer coating onto a substrate is disclosed. The configuration of the tool is according to at least one of the previous aspects. The method includes the steps of loading a substrate into the housing, providing at least a partial vacuum within the housing, introducing an inorganic material into the inorganic layer deposition station, depositing at least a portion of the inorganic material as a component of the multilayer coating, introducing an organic material into the organic layer deposition station, depositing at least a portion of the organic material as a component of the multilayer coating, curing the organic material that was deposited and controlling the migration of excess organic material out of the organic layer deposition station. Optionally, the method comprises the additional step of treating at least one surface of the substrate prior to forming a first layer of the multilayer coating. In one form, the step of controlling the migration of excess organic material comprises cooling at least a portion of the space defined by the organic layer deposition station such that the portion of the excess organic material remaining in a vapor phase in and around the organic layer deposition station is reduced. For example, chillers are placed in thermal communication with the space defined by the organic layer deposition station. Baffles may be employed to lower the conductance of vaporous contaminants across adjacent stations by reducing the flowpath area between the stations through which the gas may permeate. Additional steps may include placing an inorganic mask over the substrate prior to the step of depositing the inorganic material, and placing an organic mask over the substrate prior to the step of depositing the organic material. To reduce the incidence of seepage and related capillary phenomena, masks may be stacked to make an undercut mask, or the organic mask may be removed prior to the curing step. Removal of the mask prior to cure may also improve cure speed by eliminating mask shadowing of the edge of the organic material. Controlling the migration of excess organic material comprises cooling at least a portion of the space within the organic layer deposition station, thereby effecting a reduction of excess organic material remaining in a vapor phase in the organic layer deposition station. Chillers can be placed in thermal communication with the space defined by the organic layer deposition station to effect the cooling, while additional steps could be the placing a first accumulator upstream of the housing, placing a second accumulator positioned downstream of the housing and incorporating a device into at least one of the accumulators, the device configured to reduce the temperature on the substrate that arises from the steps of depositing the organic material, curing the organic material and the depositing the inorganic material.

According to still another aspect of the invention, a method of encapsulating an object disposed on a substrate is disclosed. The encapsulation tool can be configured according to the previously-described aspects. Steps of encapsulating an object include loading the substrate with device mounted thereto into the housing, providing at least a partial vacuum within the housing, introducing an inorganic material into the inorganic layer deposition station, depositing at least a portion of the inorganic material, introducing a organic material into the organic layer deposition station, depositing at least a portion of the decoupling organic material, isolating excess organic material in the organic layer deposition station to reduce contamination in the organic layer deposition station due to the excess (i.e., not deposited) decoupling organic material and curing the deposited organic material. Optionally, the steps of depositing the organic and inorganic materials are repeated at least once, and the materials corresponding to the two layers can be performed in any alternating order. The organic material may be introduced into the organic layer deposition station in vapor form, which can facilitate the evaporation of the organic layer through, but not limited to, vacuum flash evaporation. The step of isolating at least a portion of the organic material that was not deposited can be effected by chilling at least a portion of the organic layer deposition station such that at least a portion of the vapor form of the organic material that was not deposited condenses. The organic material can be a polymer precursor, such as a monomer, while the inorganic material can be a ceramic. These material choices may furthermore applied to any of the previously-discussed aspects.

BRIEF DESCRIPTION OF THE DRAWINGS

FIG. 3 shows a cutaway view of an object encapsulated by a multilayer coating, where the deposition of the layers is by a tool according to an aspect of the present invention;

DETAILED DESCRIPTION

Figure 1:
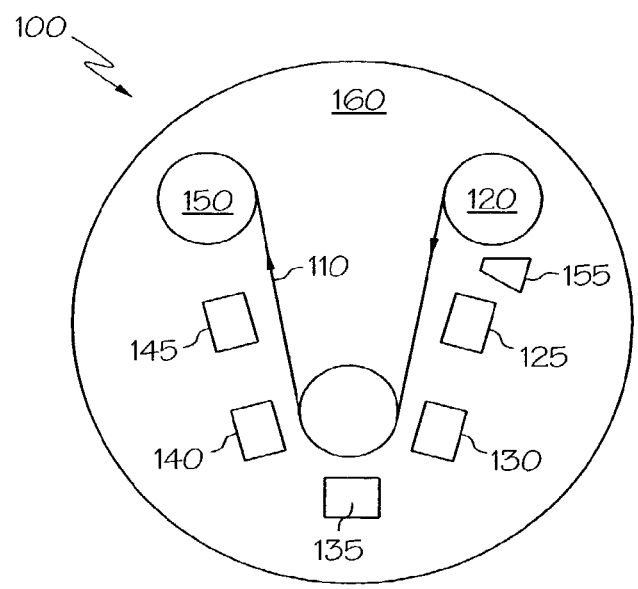
FIG. 1 is a simplified view of a roll-to-roll tool according to the prior art.

Referring first to FIG. 1, a roll-to-roll device 100 for depositing multilayer coatings on a continuous web of substrate according to the prior art is shown. A web of substrate 110 passes over a distribution reel 120 and past a first organic layer deposition station 125, curing station 130, inorganic layer deposition station 135, second organic layer deposition station 140 and curing station 145, and on to take-up reel 150. Optionally, the device 100 can include one or more surface treatment devices (such as plasma source 155) to improve the adhesion between the organic layer and the substrate 110. The interior of the device 100 defines a single chamber 160. A common vacuum is present among all of the aforementioned components. In one commonly used process, the polymer multilayer (PML) process, an organic precursor used at the first and second organic layer deposition stations 125 and 140 is flash evaporated such that when the organic precursor is introduced into the vacuum chamber 160, it evaporates, where it can then be directed to the relatively cool substrate 110 for condensation thereon. The formation of a vapor phase (evaporation) is accomplished through heating and increasing the surface area of the precursor, the latter preferably by atomization into numerous tiny droplets that increase precursor surface area by several orders of magnitude. Concurrent with the marked increase in surface area is the introduction of the droplets into a vacuum environment. U.S. Pat. No. 4,722,515, hereby incorporated by reference, demonstrates the use of heat, atomization and an evacuated environment to effect evaporation of organic precursor materials. Optionally, in the aforementioned evaporation, additional heating (thermal input) results from impinging the output from an atomizer onto a hot surface. This process, referred to as flash evaporation, is further taught by U.S. Pat. No. 4,954,371, also hereby incorporated by reference. The condensed liquid tends to planarize, thus removing a significant portion of the inherent roughness of substrate 110.

Figure 2:
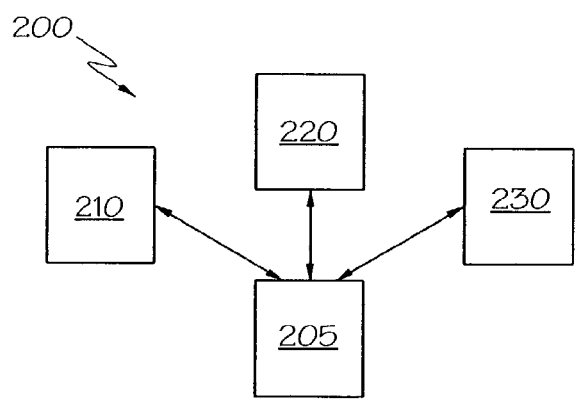
FIG. 2 is a simplified block diagram of a cluster tool according to the prior art.

Referring next to FIG. 2, a cluster tool system 200 of the prior art is shown. In a cluster tool configuration, a transport station 205 is common to all of the deposition stations 210, 220 and 230 such that the materials unique to each station do not permeate the remaining deposition stations. For example, discrete sheets of substrate (not shown) are sequentially routed between the transport station 205 and the first organic layer deposition station 210, inorganic layer deposition station 220 and second organic layer deposition station 230 until the desired finished product is obtained. Separate vacuums (not shown) are imposed on each of the deposition stations. This approach reduces the chance that the agents being deposited will be introduced at the wrong time or location, thus promoting a relatively cross-contaminant-free final product, but does so at considerable increases in time and production cost.

Referring next to FIG. 3, the present invention can be used to encapsulate an environmentally sensitive device 90 between a sheet substrate 6 and multilayer permeation-resistant coating 9, or to rapidly deposit the coating 9 directly onto the sheet substrate 6. By way of example, the environmentally sensitive device 90 can be an OLED. The sheet substrate 6 can be configured to accept one or more of the environmentally sensitive devices 90 per sheet. Furthermore, the sheet substrate 6 can be either flexible or rigid; flexible substrates include, but are not limited to, polymers, metals, paper, fabric, flexible sheet glass, and combinations thereof, while rigid substrates include, but are not limited to ceramic, metals, glass, semiconductors, and combinations thereof. In the embodiment shown, the sheet substrate 6 is made of glass, although encapsulated devices could also be placed on a plastic film support (such as polyethylene terepthalate, PET), where a barrier can be placed between the film and the device 90. The layers that make up the multilayer coating 9 are organic layers 9A and inorganic layers 9B that can be stacked in any order, with each organic layer 9A capable of being made of the same or different materials as other organic layers, while the same is true for the inorganic layers 9B. The inorganic layer 9B is used to provide protection to the environmentally sensitive device 90, while the organic layer 9A blunts or otherwise inhibits the formation of cracks or similar defects in the inorganic layer 9B. The organic layer 9A is typically in the range of about 1000-15,000 Å thick, while the inorganic layer 9B is typically in the range of about 100-500 Å thick, although it may be thicker. For example, in situations involving device encapsulation (such as shown in the figure), the first deposited inorganic layer 9B can be applied as a relatively thick layer (such as over a 1000 Å) to obtain a more thorough encapsulation. It will be appreciated by those skilled in the art that the present drawing is shown in a simplified manner to highlight the various layers, and that the drawing is not necessarily in proportion to actual layer thickness or number. The number of organic and inorganic layers 9A, 9B can be user-selected, governed by coverage and permeation resistance requirements.

The Organic Layer

In addition to performing the aforementioned crack-blunting function, organic layer 9A may (as shown in the figure) be made thicker to provide, among other things, planarization. Moreover, the layer 9A can provide thermal isolation of the underlying substrate or device, which is beneficial in reducing thermal inputs associated with subsequent depositions of inorganic layers 9B. The benefit in coating performance from alternating discrete layers over fewer thicker layers may be explained by simple redundancy, but could also be the result of nucleation of a subsequently deposited inorganic layer 9B on organic layer 9A initially deposited on first inorganic 9B layer with improved barrier properties that are not inherent in the bulk structure.

There are numerous plasma-based approaches to initiating polymerizations, cross-linking and cure of an organic layer 9A based on evaporation techniques. One approach is based on passing a flash evaporated organic material through a charged cathode/anode assembly to form a glow discharge plasma. In glow discharge plasma, a partially ionized gas is used to bombard a substrate 6. Reactive species in the gas are chemically deposited onto a substrate 6 or a layer of coating 9 thereon. After this, the organic material condenses to form an organic layer 9A that self-cures by polymerization reactions initiated by charged species resulting from plasma formation. The approach is taught by U.S. Pat. Nos. 5,902,641 and 6,224,948, both hereby incorporated by reference. A variation of this approach is based on plasma generation within a working gas that is then directed at an organic layer deposited using flash evaporation; this variation is taught by U.S. Pat. Nos. 6,203,898 and 6,348,237, and US Patent Application Publication 2002/0102361 A1, all three hereby incorporated by reference. Organic precursors suitable for forming organic layer 9A contain at least one species bearing an active functional group to enable reactions resulting in polymerization and/or cross-linking. Because it is desirable to control the onset of these reactions, and the reactions will take place in a vacuum environment, addition reactions are generally preferred. Exemplary addition reactions include the polymerization of the acrylate group (—O—CO—CR=$CH_2$, where R is typically H, $CH_3$ or CN), polymerization of the vinyl group ($R^1R^2C$=$CH_2$, where typically $R^1$ is H and $R^2$ is —O (oxygen linkage) or where $R^1$ is an aromatic or substituted aromatic and $R^2$ is H or $CH_3$), ring opening polymerization of the cycloaliphatic epoxy groups and the reactions of isocyanate (—NCO) functional species with hydroxyl (—OH) or amine (—$NH_2$)

functional species. Ease of reaction and availability favor acrylate and vinyl functional materials, but other materials may also be used.

The reactive species incorporated into suitable organic precursors can be monomers (simple structure/single unit) bearing at least one functional group, oligomers (composed of two to several repeating units) bearing at least one functional group, or polymers bearing at least one functional group. As used herein, monomer is meant to include species referred to as monomeric, and the terms oligomers and/or polymers are meant to include species referred to as oligomeric, polymeric, prepolymers, novalacs, adducts, and resins, when the last mentioned bears functional groups. The reactive species (i.e., monomer, oligomer or polymer) can bear two or more similar or dissimilar functional groups, while suitable organic precursors can include two or more of these reactive species. By way of example, these could be made up of two or more monomeric species, one or more monomeric species combined with an oligomeric species or one or more monomeric species combined with a polymeric species. It will be appreciated by those skilled in the art that the numbers and natures of the reactive species that can be used in combination are not subject to set limitations. In addition, the organic precursors may include one or more species that are not polymerizable and/or cross-linkable and are liquids or solids. Examples include the aforementioned photoinitiators, which are species that fragment to produce free radicals that induce free radical-based reactions (including polymerizations) in response to UV exposure. When solid, these species may be present as dispersions, colloidal dispersions, or in solution, and may be ionic in nature, such as salts of inorganic or organic species. When liquid, the non-reactive species may be present as emulsions, as colloids, or as miscible components.

The liquid multilayer (LML) process, disclosed by U.S. Pat. Nos. 5,260,095, 5,395,644 and 5,547,508 (incorporated herein by reference), bears some resemblance to the PML process previously described by employing many of the same organic materials used in the PML's flash evaporation-based approach, but can further work with a range of higher molecular weight materials that can not be used via flash evaporation. In essence, the LML process involves applying a liquid material to a surface and then inducing a cure (polymerization) in contrast to the PML approach of condensing a flash evaporated organic and then inducing a cure (polymerization).

The Inorganic Layer

The inorganic layer 9B depicted in the figure can be a ceramic layer that can be vacuum deposited onto the top surface of device 90, onto the surface of sheet substrate 6, or onto the organic layer 9A already on sheet substrate 6. Vacuum deposition methods for the inorganic layer 9B include, but are not limited to, sputtering, chemical vapor deposition, plasma enhanced chemical vapor deposition, evaporation, sublimation, electron cyclotron resonance-plasma enhanced vapor deposition, and combinations thereof. Sputtering typically involves the bombardment of a cathode material by gas ions in a low pressure environment, thereby ejecting atoms of the cathode material from the cathode surface. The ejected atoms then impinge upon a substrate placed in their path, thereby resulting in a deposit of the cathode material atoms onto the substrate surface. Sputtering devices have used both electric and magnetic fields to accelerate the gas ions toward the cathode surface. By passing a magnetic field through the cathode material, enhanced deposition rates can be achieved. Moreover, to avoid burn-through of the cathode material created by the fixed presence of the adjacent magnets, the magnets were moved (such as being rotated) relative to the target cathode. Specific refinements of this idea include cylindrical tube cathodes that rotate about fixed magnets, thus promoting relatively even consumption of the cathode material. By adding reactive capability, sputtering devices (including rotatable cylindrical devices) can be used to deposit ceramic and related non-metal materials, while the control of the buildup of electrically nonconductive layers of sputtered material avoids a drift in process parameters that would otherwise occur during deposition. Rotary sputtering is taught by U.S. Pat. No. 6,488,824 B1, the entire disclosure of which is incorporated herein by reference.

Sputtering can be reactive (in the case of depositing of ceramic or dielectric materials, such as the oxides and nitrides of metals) or non-reactive (where metals are deposited). In reactive sputtering, metal ions are generated from a sputter source (cathode) and subsequently converted in a reactive atmosphere to a metal compound deposited on the substrate. Use of oxygen as the reactive gas will result in the deposition of a layer of metal oxide, while the use of nitrogen or a carbon source such as methane as reactive gases will result in the deposition of layers of metal nitride or metal carbide respectively, and reactive gas mixtures can be use to produce more complex layers. Alternatively, a ceramic target can be RF sputtered onto the substrate 6. In either case, the inert working gas is usually argon. In one form, the sputtered ceramic layer 9B can be $Al_2O_3$ because of its ready availability and known deposition parameters. It will be appreciated, however, that other suitable deposition processes (such as the aforementioned thermal evaporation) and other inorganic layer materials (such as the aforementioned non-oxides $MgF_2$ and LiF) could also be used. As with the organic layer 9A, in situations involving device encapsulation, this first deposited layer 9B can be applied relatively thickly (such as over a 1000 Å) to obtain a higher quality encapsulation, while subsequently deposited barrier stacks can provide the required environmental protection for the encapsulated device. While either reactive or non-reactive sputtering can be used to facilitate deposition of inorganic layer 9B on either sheet substrate 6 or environmentally sensitive device 90, the reactive approach is preferred, as this technique provides higher deposition rate and denser film for a better barrier. Non-reactive processes can be advantageous where concerns about damage to the object being encapsulated are important. For example, if the environmentally sensitive device 90 is the aforementioned OLED, it might be necessary to protect it its upper cathode layer from the effects of a reactive gas. The closeness of the deposition source to the surface being deposited on is determined in part by which of the aforementioned deposition approaches are used. By way of example, the inventors have discovered that an approximately six inch sputter spacing between the two produces good results. Generally, the closer the surface is to the source, the higher the deposition rate, the trade-off being that if the surface and source are too close, high heat build-up can occur on the surface. In addition to closeness, the orientation of the surface relative to the source (whether above or below, for example) is dependent on the type of device being encapsulated. Upward deposition has been used more extensively in the past, because thermal evaporation is typically an upwardly-directed phenomenon. If the substrate is large, downward or sideways deposition may instead be preferred. The energy input for the various deposition processes can also come in many forms, and can interact with other deposition considerations, such as whether reactive or non-reactive methods are used. For example, a direct current (DC) input with a reverse bias pulse is currently compatible with an $Al_2O_3$ layer, and is relatively simple and provides a high deposition rate. This is also beneficial in arc suppression and control, as well as related particle generation. There are other possible energy sources for depositing ceramic and related dielectric materials, such as alternating current (AC) or radio frequency (RF), especially for situations where arcing is to be avoided, and where the relatively high speed deposition rates of pure metals is not required.

Figure 4A:
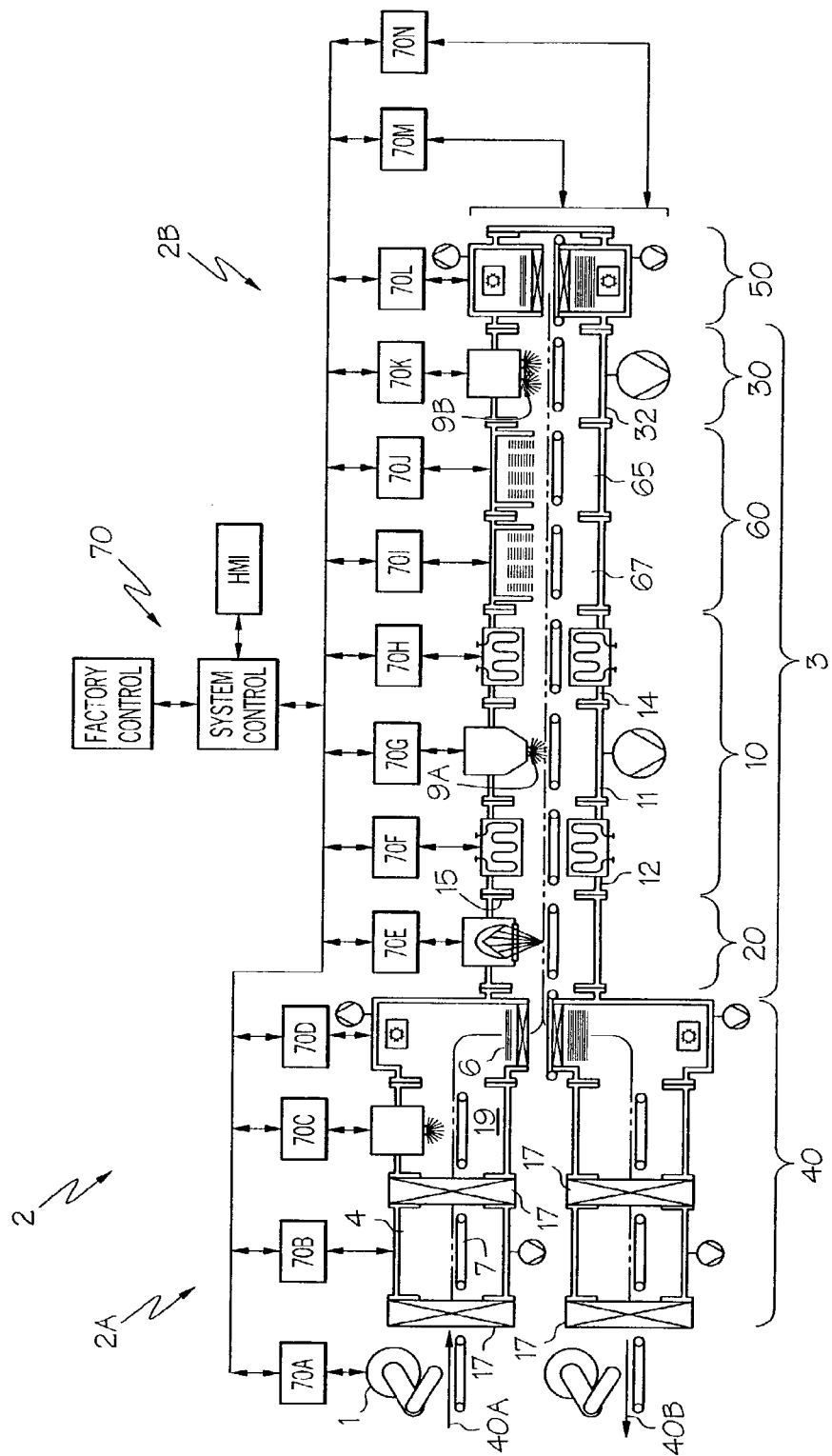
FIG. 4A is a diagrammatic view of an in-line encapsulation tool with a single organic layer deposition station according to an aspect of the present invention.

Referring next to FIG. 4A, an in-line encapsulation tool 2 for depositing multilayer coatings on the sheet substrate 6 according to an aspect of the present invention is shown. The encapsulation tool 2, with proximal end 2A and distal end 2B, includes a deposition housing 3, the inside of which can be evacuated. Deposition housing 3 collectively defines an organic layer deposition station 10, curing station 20, inorganic layer deposition station 30 and mask station 60 such that all four stations operate under a single vacuum. To ensure a common vacuum between the stations 10, 20, 30 and 60 inside deposition housing 3, openings between adjacent stations are coupled together to establish an open flowpath between them. As used herein, "coupled" refers to components that are connected to one another, but not necessarily directly connected. In the present context, intervening pieces of equipment between the two pieces "coupled" together would not be destructive of a coupled arrangement so long as some connectivity is present.

The configuration of the encapsulation tool 2 shown involves a shuttling of the sheet substrate 6 back and forth through the organic layer deposition station 10, curing station 20, inorganic layer deposition station 30 and mask station 60 over multiple bi-directional trips to achieve the desired number of deposited layers. As will be discussed in more detail below, the encapsulation tool 2 can also be configured as a unidirectional device such that the requisite number of layers can be deposited in a single pass through the system. The inorganic layer deposition station 30 comprises a deposition chamber 32 for depositing inorganic layer 9B, the details of which are discussed above. The organic layer deposition station 10 includes a first migration control chamber 12, a deposition chamber 11 for depositing organic layer 9A, and a second migration control chamber 14. Temperature control of the substrate is one way in which migration control of the material making up the organic layer 9A can be achieved. Since the organic layer deposition step is very sensitive to substrate temperature (particularly elevated substrate temperatures), where cooler substrates will condense more organic precursor uniformly and rapidly, particular emphasis has been placed on cooling the substrate. To that end, cooling (for example, in the form of chillers or thermal masses placed in migration control chambers 12, 14 can be introduced along the deposition path to keep the substrate 6 and the coating 9 or environmentally sensitive device 90 thereon from overheating. This cooling minimizes the dispersion of any organic precursor vapor to adjacent stations to avoid encapsulation tool hardware fouling. In addition, by reducing the quantity of excess organic precursor vapor before the sheet substrate 6 moves to the next station, the encapsulation tool 2 effects a concomitant reduction in the likelihood that subsequent coating layers will become contaminated. Coolant (cryogenic or other) feed tubes (not shown) connect the chiller (not shown) to the first migration control chamber 12 so that the feed tubes can disperse a chilling fluid (such as liquid nitrogen) over the top and bottom of the sheet substrate 6. The feed tubes have a supply and a return. The coolant is isolated from the vacuum.

In addition, cycle purge can be employed to reduce contamination in the feed interface section. Baffles 15 situated on the proximal and distal sides of organic layer deposition station 10 further contain the vaporous organic precursor within the localized space in which it is deposited. The baffles 15 could also be added to other stations to partially shield the open flowpath defined by the contiguous entrances and exits of the various stations from stray vapor dispersion. The flowpath is open enough to ensure that common vacuum between the stations is not compromised. Once the deposition process is complete, the sheet substrate 6 goes into a second migration control chamber 14 similar to that described in conjunction with the first migration control chamber 12 above.

Curing station 20 is configured to cure organic layer 9A that was deposited in organic layer deposition station 10. Upon curing of the organic layer 9A, additional layers may be deposited. Cure or cross-linking results from free radical polymerizations that can be initiated by exposure to an electron beam (EB) source or by exposure to an ultraviolet (UV) source when the aforementioned photoinitiators are incorporated into the organic precursor. In certain deposition scenarios, such as where a device 90 is placed on the substrate 6, the use of UV is preferred to that of EB, as relying on UV exposure to cure the condensed layer rather than an EB source helps to avoid concerns over the impact of the more harsh EB exposure. By way of example, EB exposure can be up to several kilo-electron volts (keV) on the underlying device 90. It will be appreciated by those skilled in the art that polymerization (cross-linking) based on UV exposure is not limited to free radical mechanisms. There are photoinitiators that liberate cationic initiators (so-called Lewis-acids, Bronstead-acids, onium salts, etc.) enabling the use of cationic polymerization mechanisms. Use of these curing mechanisms in combination with flash evaporation is taught by US Patent Application Publication 2002/0156142 A1, hereby incorporated by reference. Cationic polymerization facilitates use of a large family of vinyl functional and cycloaliphatic epoxy function organic materials that are not ideally used in free radical polymerizations, but are still considered addition polymerizations.

Mask station 60 can include inorganic mask placement device 65 and organic mask placement device 67, each to overlay the environmentally sensitive objects 90 deposited on sheet substrate 6 with thin, card-like masks. The masks prevent deposition of organic layer 9A onto selected regions of substrate 90, such as electrical contacts, and can be used to define (control) the overlap relationship between inorganic layers 9B and organic layers 9A, where such relationship is beneficial in edge seal design. In the case of the organic mask placement device 67, the overlaid masks can further be used to allow selective exposure and subsequent cure of portions of the deposited organic layer 9A. In the deposition of inorganic layer 9B, portions of the mask may effect protection of the environmentally sensitive objects 90 (such as an OLED cathode) from heat or particulate matter by acting as shields, as they are placed between the source cathode and the substrate to be coated and act as a mask to limit (define) the area of the substrate exposed to the source.

The proximal end 2A of the encapsulation tool 2 can be configured as an accumulator 40 to allow an interface of the deposition stations of housing 3 to upstream or downstream equipment, or to the ambient external environment, such as for loading and unloading substrate 6. The accumulator 40 acts as a wait station for one or more of the substrates 6 that are about to be processed, providing a stable, relatively isolated environment where, for example, temperature and atmospheric agitation reduction can be effected, thereby improving the overall quality of the deposition process. The accumulator 40 includes an inlet 40A and an outlet 40B spaced apart from inlet 40A. The accumulator may include isolation chambers 4 defined by isolation valves 17 such that once the substrate 6 is loaded in the accumulator 40, at least partial isolation from the ambient environment may commence. As previously mentioned, vacuum and thermal control can be produced in the accumulator 40. The thermal reduction can be achieved by thermal mass heat sinks that are placed in contact with or adjacent the substrate 6 at one or more discrete locations, or by a chilled fluid (such as liquid nitrogen) system. These heat sinks can be used to reduce the temperature of the substrate 6 prior to the substrate 6 entering the various deposition stations, as well as cool the substrate during the deposition process.

In addition to supporting at least partial environmental isolation for the substrate 6, the accumulator 40 may also include one or more surface treatment chambers 19 to improve the adhesion of one of the organic layer 9A or inorganic layer 9B to substrate 6. The surface treatment chamber 19 may be a plasma energy (glow discharge) source and may use an inert working gas, a reactive working gas or a combination therefore. The energy source to generate the plasma can come from RF, AC and DC, and may include a downstream plasma source, where the plasma is generated remotely and delivered to remove organic contaminants that may have coated various components therein. The treating, which causes increased surface energies accompanied by increased hydrophilic behavior, enhances adhesion between the substrate and the first formed layer, thereby enabling formation of a better bond therebetween. In situations involving a flexible substrate, such as the aforementioned PET film, additional improvements in film compliance and contaminant reduction is also enabled by surface treating. This is important, as these contaminants (typically in the form of low-molecular-weight species) are migratory, thus capable of spreading to other layers. In addition, the inorganic layers can be treated to effect enhanced adhesion with subsequently deposited organic layers. For encapsulation, it is probably sufficient to treat only the surfaces of the inorganic layers of the multilayer coating. This is based on the inventors' belief that the improvements to adhesion occur by treating the inorganic layer surfaces rather than the surfaces of the organic layers. A second accumulator 50 can define the distal end 2B of encapsulation tool 2. This accumulator, while capable of possessing all of the features of accumulator 40, is preferably simpler, providing optional temperature control and turnaround and wait-state containment of one or more substrates 6.

Once the proper environmental conditions have been established for the substrate 6 in accumulator 40, the substrate 6 is transported along conveyor 7 to housing 3, where, depending on the deposition strategy, the layers 9A, 9B of multilayer coating 9 will be deposited. For example, an eleven layer coating 9 could be formed from five organic layers 9A interspersed among six inorganic layers 9B. Furthermore, it may be preferable to deposit the inorganic layer 9B as the first layer on the substrate 6, onto which alternating layers of organic and inorganic layers 9A, 9B may subsequently be placed. Contrarily, it may be preferable to reverse the order, having the organic layer 9A as the first layer on the substrate 6. Although shown in a one-sided configuration, the inorganic layer deposition station 30 can be configured to provide two-sided treatment of the substrate.

Next, the sheet substrate 6 travels to the deposition chamber 11 within organic layer deposition station 10, to receive an organic layer 9A of multilayer coating 9. The organic layer 9A is preferably deposited via an evaporative process such as PML, where the precursor material can be in the form of a liquid solution, liquid with solid dispersion or liquid with liquid-immiscible mixture. Evaporation may be performed by supplying a continuous liquid flow of the organic layer precursor material into the vacuum environment at a temperature below both the decomposition temperature and the polymerization temperature of the precursor, continuously atomizing the precursor into a continuous flow of droplets, and continuously vaporizing the droplets in a heated chamber having a temperature at or above a boiling point of the precursor, but below a pyrolysis temperature.

Once the sheet substrate 6 reaches the accumulator 50 at the distal end 2B of encapsulation tool 2, it may subsequently be sent in a reverse direction in order to pass through curing station 20 to harden the organic layer 9A that was just deposited in the organic layer deposition station 10. Similarly, such a configuration establishes a compact system for the deposition of additional layers 9A, 9B of multilayer coating 9 as the sheet substrate 6 can simply be turned around to pass through the existing components defined by the organic layer deposition station 10, curing station 20 and inorganic layer deposition station 30 in reverse order. The sheet substrate 6 can travel through the encapsulation tool 2 as many times as desired to receive the appropriate number and type of layers 9A, 9B of multilayer coating 9. The encapsulation tool 2 may also include other deposition stations (not shown) to deposit additional coatings on the sheet substrate 6 including, but not limited to, scratch resistant coatings, antireflective coatings, anti-fingerprint coatings, antistatic coatings, conductive coatings, transparent conductive coatings, and other functional layers. Additional equipment can be connected to encapsulation tool 2, including a testing (or measurement) chamber 8 (shown later) that can be used for quality-control purposes, such as to provide indicia of the adequacy of the multilayer coverage. For example, a calcium-based referee sample can be created to support oxygen and water permeability tests of the multilayer coating that is being applied via the apparatus of this invention. Such additional deposition stations (if present) could be included either upstream or downstream of the accumulator 50.

Control system 70, made up of individual controllers 70A-70N, is used to dictate process parameters, including the order of deposition of the inorganic and organic layers, as well as thermal, motion and utilities control. For example, thermal control 70D can include hardware and software that is coupled to the thermal control devices in the accumulator 40 to chill the substrate 6, while thermal control 70F and 70H can be used to operate the contaminant reduction devices of the migration control chamber 12. Motion control 70M includes hardware and software that tracks the position of the substrate 6 while being transported by conveyor 7 along the encapsulation tool 2. Utilities control 70N includes hardware and software to provide electrical power, process gas, vacuum, compressed air and chilled water to the individual stations. Similarly, the factory control interfaces external systems for material management and process status. The human machine interface (HMI) is the control panel, computer, software, screen, keyboard, mouse and related equipment that allows an operator to run the system.

The control system 70 can shuttle the sheet substrate 6 (and any environmentally sensitive device 90 thereon to be encapsulated, if present) in any order to accommodate particular encapsulation or barrier deposition configurations.

Figure 4B:
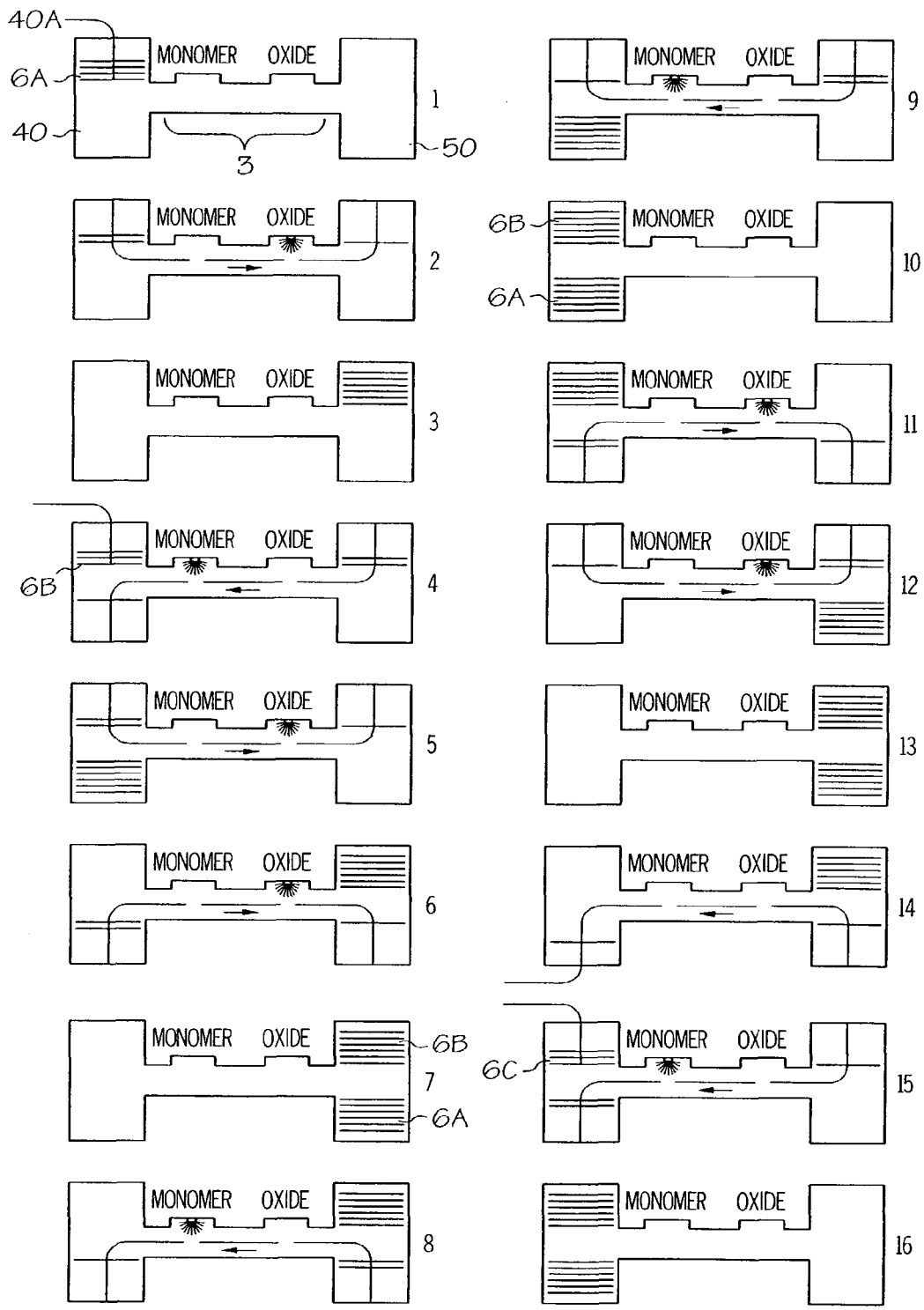
FIG. 4B is a diagrammatic view of the positions of the substrate as it traverses back and forth through the tool of FIG. 4A during the multilayer deposition process, highlighting the tool's ability to handle multiple batches of substrates simultaneously.
Figure 5A:
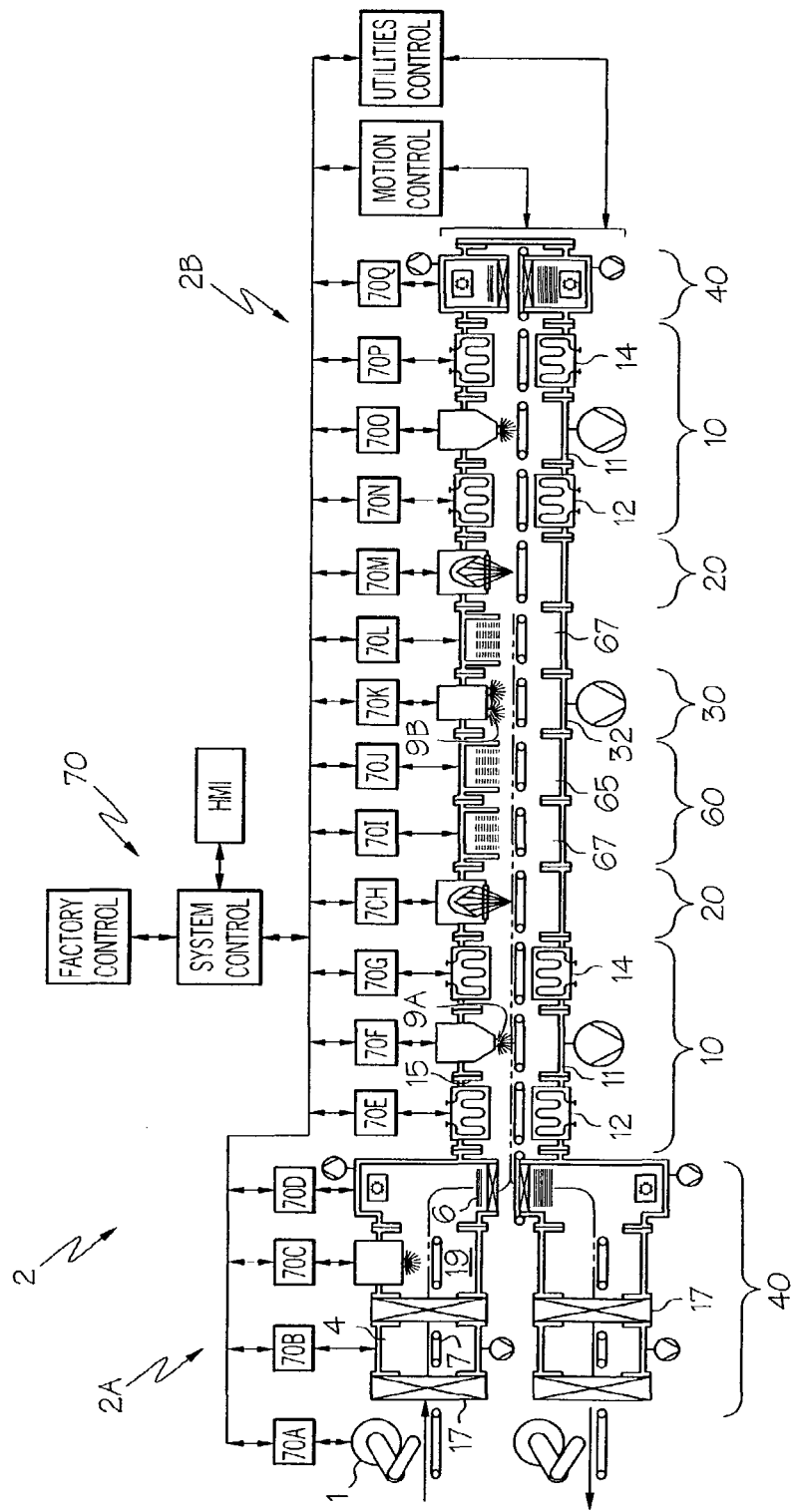
FIG. 5A is a diagrammatic view of the in-line encapsulation tool with dual organic layer deposition stations according to an alternate embodiment of the present invention.

Referring next to FIG. 4B in conjunction with FIG. 4A, sixteen simplified steps showing the preferred deposition order of a two-layer coating 9 traversing an encapsulation tool 2 comprising a single organic layer deposition station 10 are shown, noting with particularity that the device shown is capable of processing two batches of substrates 6A, 6B simultaneously. The configuration of the encapsulation tool 2 shown in FIG. 4A with accumulators 40, 50 disposed on opposite ends of housing 3 allows the substrate 6 to be routed in a bi-directional path through the encapsulation tool 2 as many times as needed to build up the multilayer coating 9. By having a second accumulator 50 disposed at the distal end 2B of encapsulation tool 2, multiple batches of substrate 6 can be loaded and processed simultaneously. It will be appreciated by those skilled in the art that while the number of batches that can be produced simultaneously in the tool of FIGS. 4A and 5A is preferably two in number, the present device is not so limited, as additional accumulators and related isolation containers (none of which are shown) can be coupled to the existing tool to improve batch throughput.

In step 1 of the operation, the first batch 6A of sheet substrates 6 is loaded into accumulator 40 at proximal end 2A. After stable environmental conditions are established in the accumulator 40 (such as temperature reduction, establishment of a predetermined vacuum level or the enhancement of surface properties in surface treatment chamber 19), the sheet substrates 6 are moved sequentially past the organic layer deposition station 10 and curing station 20 by a conveyor 7 to the mask station 60. A pallet (not shown) to carry the sheet substrate 6 may contain holes therethrough to facilitate deposition of the layers of multilayer coating to the bottom of the sheet substrate 6, if desired, such as for two-sided coating deposition. Furthermore, an open palette may allow the substrate to better "see" a chill plate or related thermal management device, thereby increasing the contribution of the chill plate to substrate thermal management.

Upon arrival at the mask station 60, the substrate 6 first receives a mask from inorganic mask placement device 55, after which it moves (as shown in step 2) to inorganic layer deposition station 30 to receive inorganic layer 9B. The energy applied (which may come from, by example, a 2 kilowatt pulsed DC source applying a reactive coating in an exothermic reaction) to the substrate 6 from the inorganic layer deposition station 30 may raise the temperature of the substrate significantly.

To counteract this increase in temperature (which could otherwise adversely impact the ability of the substrate to accept organic layer 9A in subsequent deposition steps), the substrate is temporarily placed in accumulator 50, as shown in step 3, where the thermal control features of accumulator 50 can be activated to both effect temperature reduction, as well as position the substrates 6 of batch 6A for a return trip through housing 3. At this time, as shown in step 4, a second batch 6B can be introduced into the inlet 40A of accumulator 40 at the proximal end of encapsulation tool 2, while the substrates 6 from batch 6A traverse the reverse direction, receiving an organic layer coating from organic layer deposition station 10 with subsequent curing (not presently shown). In step 5, the individual substrates 6 of second batch 6B receive the same layer deposition as the first batch 6A did in step 2. In step 6, the first batch 6A repeats that of step 2, being routed after deposition to separate wait space in accumulator 50 so as not to mix with second batch 6B. After this step, the first batch 6A has an inorganic-led first organic/inorganic layer pair 9A/9B of coating 9. As such, a first inorganic layer 9B is part of the foundation pair (composed of first inorganic layer 9B and first organic layer 9A) that decouples or isolates the barrier coating 9 from the underlying substrate 6 or device 90. In step 7, both batches 6A and 6B are contained in accumulator 50, while in step 8, the first batch 6A receives a second organic layer 9A and cure. In step 9, each substrate 6 of the second batch 6B receives its first deposition of organic layer 9A until both batches 6A and 6B are stored in the accumulator 40, as shown in step 10. After step 11, the first batch 6A has two organic/inorganic layer pairs 9A/9B of coating 9 disposed on the substrates 6. Step 12, once completed, leaves second batch substrates 6B with a first inorganic layer 9B and a first organic/inorganic layer pair 9A/9B of coating 9. Step 13 is a wait state similar to that of step 7. Step 14 depicts the substrates 6 from first batch 6A exiting the encapsulation tool 2 through outlet 40B in accumulator 40. In step 15 (which repeats the process of step 4), second batch 6B receives an organic layer 9A and curing, while a new batch 6C is loaded into the inlet 40A of accumulator 40. Step 16 shows the second and third batches 6B, 6C in a wait state in accumulator 40. It will be appreciated that modifications to the above steps are possible; for example, if greater or fewer numbers of layers are required, the number of passes through the encapsulation tool 2 can be varied accordingly. It will be appreciated by those skilled in the art that while the order (i.e., inorganic-led) of the foundation pair is currently preferred based on the substrates currently in use, the present system can be configured to provide an organic-first deposition strategy for other substrate compositions that would require such an approach.

Figure 4C:
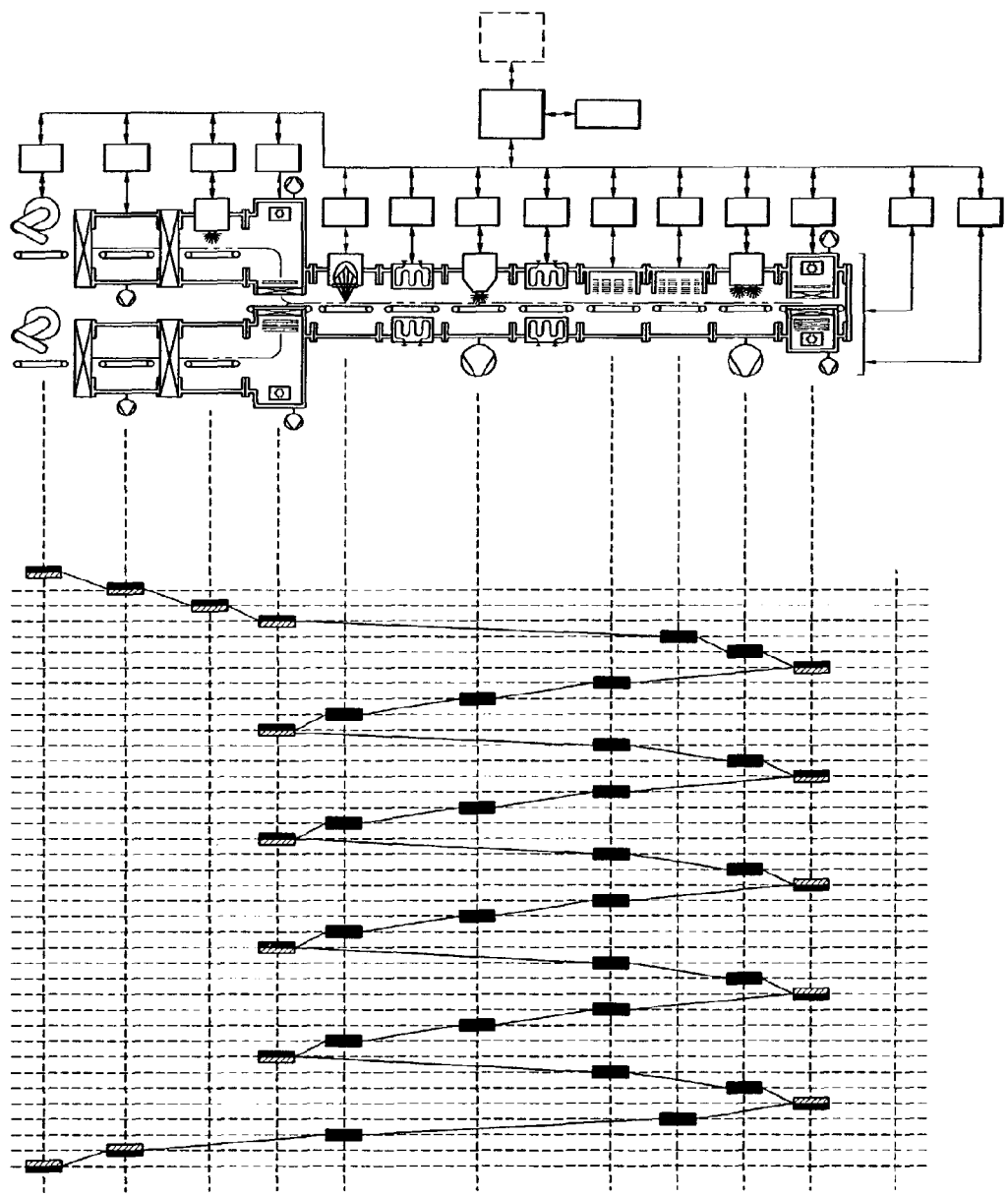
FIG. 4C shows a juxtaposition of the tool of FIG. 4A with a sequencing diagram, showing the order in which various components in the tool are activated to produce a multilayer coating.

Referring next to FIG. 4C, the juxtaposition of the encapsulation tool of FIG. 4A and a flowchart showing the shuttling of a substrate 6 is shown, producing a four-layer coating 9. In this case, the inorganic (oxide) mask can be applied once, followed by applying (overlaying) the organic mask only for inorganic (oxide) depositions. This configuration allows easy creation of undercut masks from two flat masks.

Figure 5B:
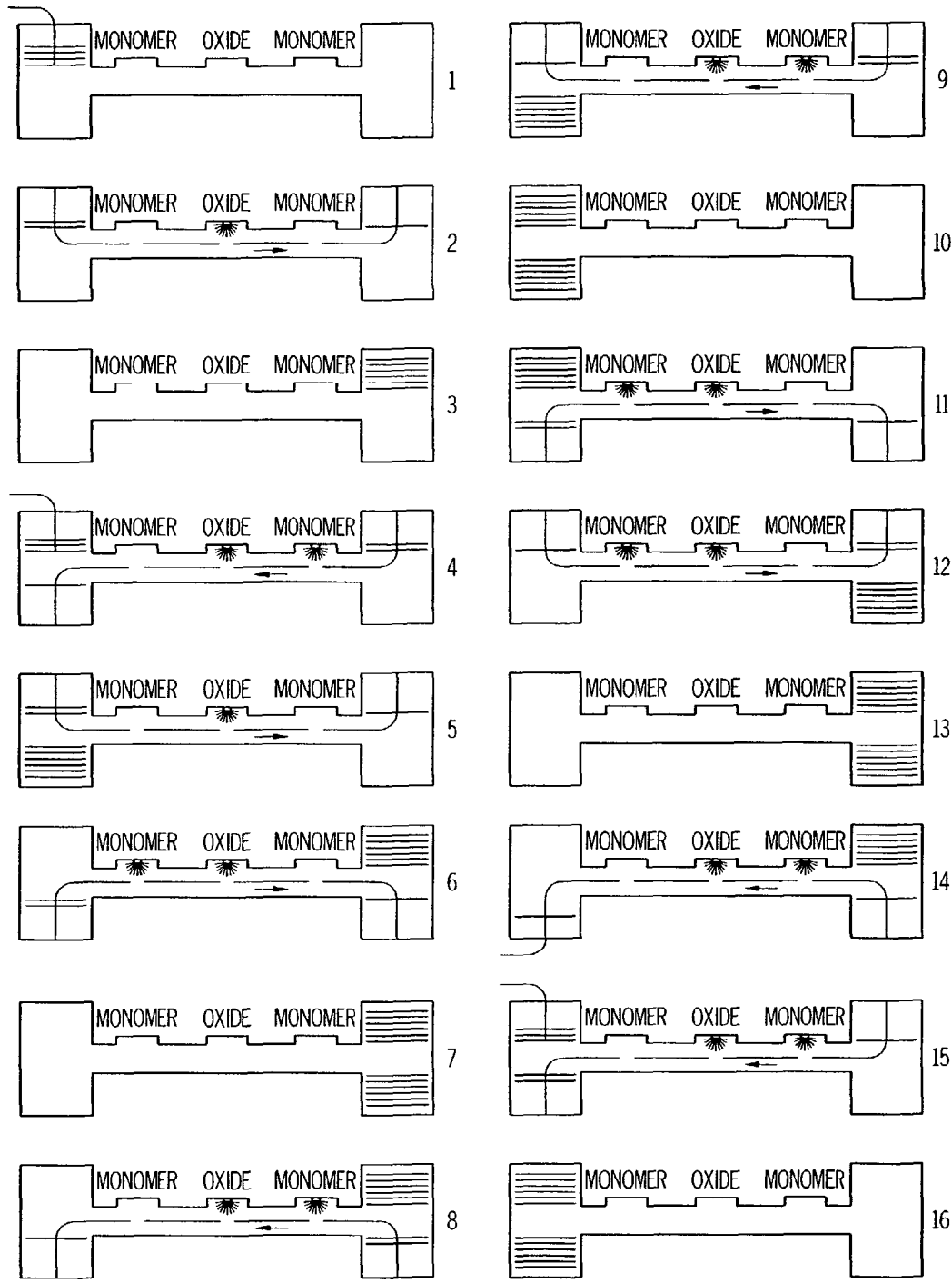
FIG. 5B is a diagrammatic view of the positions of the substrate as it traverses back and forth through the tool of FIG. 5A during the multilayer deposition process, highlighting the tool's ability to handle multiple batches of substrates simultaneously.

Referring next to FIGS. 5A and 5B, the encapsulation tool 2 has multiple organic layer deposition stations 10 such that, like the configuration shown in FIG. 4A, it can operate under a common vacuum. While this variant of the system includes extra components, it has the advantage of having the housing 3 be repeated (not shown) such that all of the required layers of multilayer coating 9 can be deposited a fewer passes, thus improving throughput. As an alternative, if enough housings 3 are juxtaposed, the substrate 6 can be made to travel unidirectionally, thus simplifying the accumulators 40, 50 which would no longer require turnaround features. The number and arrangement of such a station arrangement will depend on the required configuration of the layers in the multilayer coating 9, and can be configured accordingly. The encapsulation tool 2 can furthermore be configured to deposit the organic and inorganic layers 9A, 9B in any order, as well as to put an object either directly on the sheet substrate 6 or on one or more layers of the multilayer coating. For example, while the preferred embodiment is to have the sheet substrate 6 be placed into the encapsulation tool 2 with the object to be encapsulated already mounted, the tool can also be configured to have the substrate 6 enter the encapsulation tool 2 empty, to have the object placed onto it once it is in the tool 2. Also, as with the configuration of the tool 2 as shown in FIG. 4A, baffles 15 can be used to straddle the various stations, especially the organic layer deposition station 10, to reduce migration of the material used to make up the organic layer 9A. The simplified steps of FIG. 5B mimic those previously described in conjunction with FIG. 4B, modified to take into account the additional organic layer deposition station 10.

Figure 6:
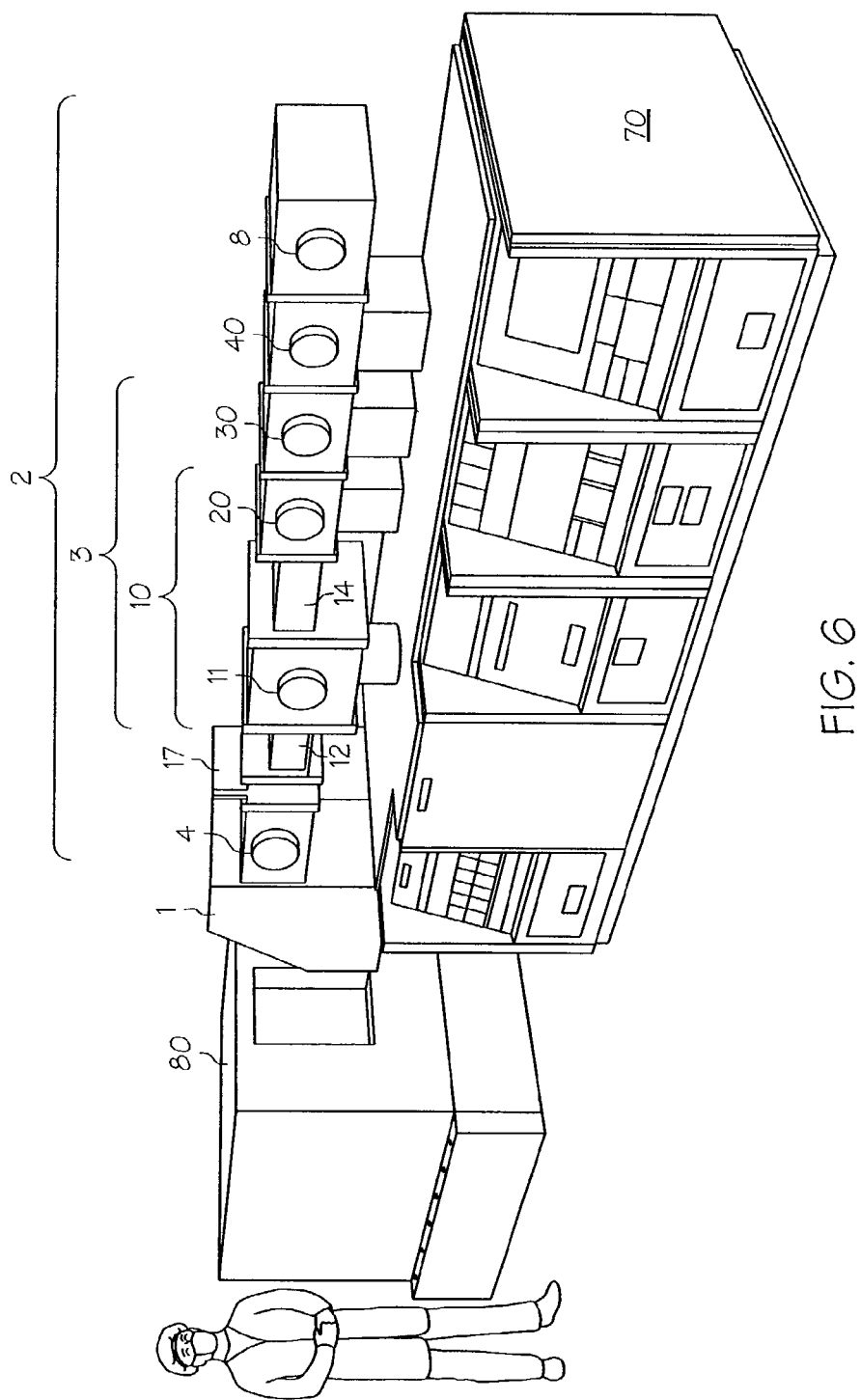
FIG. 6 is a perspective view showing the juxtaposition of the encapsulation tool with a controller of the present invention with an active device deposition apparatus.

Referring next to FIG. 6 in conjunction with FIG. 3, the encapsulation tool 2 of FIG. 4A is shown connected to control system 70 and an external material handling apparatus 80, all for depositing an environmentally sensitive device 90, such as an OLED, on sheet substrate 6. The external material handling apparatus 80 can be configured to allow either manual or automated interfacing with the encapsulation tool 2. Optional measurement chamber 8 is shown adjacent an accumulator 40 at the end of the tool 2. In situations where the tool can be used for in-line device (OLED) manufacturing, an interface that maintains a suitable vacuum and includes handoff means to transfer substrates with devices in place to the tool 2 would be employed. Although not presently shown, an accumulator 40 positioned between the two is advantageous, providing a means to deal with speed matching, problem resolution (such as stop-and-fix), maintenance, cool downs, or the like. In another approach (not shown), the tool 2 is separate from the device (OLED) manufacturing line. The manufacturing line will need a delivery with means for emplacing substrates with devices into a transport container that can be sealed and afterwards maintain a suitable vacuum. In this circumstance, the tool 2 will require a feed with means for receiving the transport container, opening, and hand-off loading onto the tool transport system. The line delivery and the tool receiver have to include means to establish and maintain suitable vacuums. Also, contrary to that of FIGS. 4A and 5A, isolation chambers 4 need not be part of accumulator 40, but may be separate devices.

While certain representative embodiments and details have been shown for purposes of illustrating the invention, it will be apparent to those skilled in the art that various changes may be made without departing from the scope of the invention, which is defined in the appended claims.

What is claimed is:

1. A method of encapsulating an object disposed on a substrate, said method comprising:
    configuring an encapsulation tool to comprise:
        a proximal end configured to accept said substrate;
        a distal end opposite said proximal end;
        an accumulator cooperative with at least one of said proximal end and said distal end such that said accumulator contains a batch of said substrates at least before, after or between steps of deposition of a multilayer coating;
        at least one surface treatment chamber comprising a thermal evaporation device configured to deposit a non-oxide material, said thermal evaporation device disposed in said accumulator and configured to enhance the ability of individual layers of said multilayer coating to adhere to said substrate or an adjacent layer; and
        at least one housing disposed substantially between said proximal and distal ends, said housing defining a common vacuum and a substantially linear deposition path therein, said common vacuum configured to be coupled to a vacuum source and said substantially linear deposition path arranged to facilitate transport of said substrate through said housing, said housing comprising:
            at least one transport means configured to convey said substrate along said substantially linear deposition path;
            at least one organic layer deposition station configured to deposit at least one organic layer of a multilayer coating onto said substrate;
            at least one curing station configured to cure an organic layer deposited by said organic layer deposition station;
            at least one inorganic layer deposition station configured to deposit at least one inorganic layer of said multilayer coating onto said substrate; and
            at least one contamination reduction device to control the migration of material making up said organic layer from said organic layer deposition station in which said material originated;
    loading said substrate with said object disposed thereon into said housing;
    providing at least a partial vacuum within said housing;
    introducing a inorganic material into said inorganic layer deposition station;
    depositing at least a portion of said inorganic material onto said substrate while said substrate is in said inorganic layer deposition station;
    introducing an organic material into said organic layer deposition station;
    depositing at least a portion of said organic material onto said substrate while said substrate is in said organic layer deposition station;
    isolating excess said organic material to effect a reduction in organic material contamination; and
    curing said deposited organic material.

2. The method according to claim 1, wherein said steps of depositing said organic and inorganic materials are repeated at least once.

3. The method according to claim 2, wherein said steps of depositing said organic and inorganic materials can be performed in any order.

4. The method according to claim 1, wherein said organic material is introduced into said organic layer deposition station in vapor form.

5. The method according to claim 4, wherein isolating excess organic material comprises chilling at least a portion of said organic layer deposition station such that at least a portion of said excess organic material in said vapor form condenses.

6. The method according to claim 4, wherein said organic material is deposited via flash evaporation.

7. The method according to claim 1, wherein said organic material is a polymer precursor.

8. The method according to claim 1, wherein said inorganic material is a ceramic.

* * * * *